(12) United States Patent
Onga et al.

(10) Patent No.: US 6,514,885 B1
(45) Date of Patent: Feb. 4, 2003

(54) SEMICONDUCTOR DEVICE MANUFACTURING METHOD TO REDUCE PROCESS INDUCED STRESS AND CRYSTALLINE DEFECTS

(75) Inventors: Sinji Onga, Fuji-Sawa (JP); Robert W. Dutton, Palo Alto, CA (US); Kyeongjae Cho, Union City, CA (US); Hideki Takada, Yokohama (JP); Takako K. Okada, Tokyo (JP); Hiroshi Ohtani, Yokohama (JP); Yoshinori Asahi, Yokohama (JP)

(73) Assignees: Kabushiki Kaisha Toshiba (JP); Board of Trustees of Leland Stanford Jr. Univ., The, Palo Alto, CA (US)

( * ) Notice: Subject to any disclaimer, the term of this patent is extended or adjusted under 35 U.S.C. 154(b) by 0 days.

(21) Appl. No.: 09/564,087

(22) Filed: May 3, 2000

(51) Int. Cl.$^7$ .......................... H01L 21/31; H01L 21/469
(52) U.S. Cl. ....................... 438/787; 438/424; 438/435; 438/437; 257/510
(58) Field of Search ............................... 438/787, 424, 438/296, 435, 437; 257/510

(56) References Cited

U.S. PATENT DOCUMENTS

| | | | | |
|---|---|---|---|---|
| 5,192,707 A | * | 3/1993 | Hodges et al. | 437/70 |
| 5,994,756 A | * | 11/1999 | Umezawa et al. | 257/510 |
| 6,130,482 A | * | 10/2000 | Iio et al. | 257/774 |
| 6,277,707 B1 | * | 8/2001 | Lee et al. | 438/430 |
| 2001/0014513 A1 | * | 8/2001 | Levy | 438/438 |

OTHER PUBLICATIONS

K. Schonenberg, 'Stability of Size Strained Layers on Small Areas Trench Isolated Silicon Islands', Proceedings of the Fourth International Symposium on Process Physics and Modeling in Semiconductor Technology. Electrochemical Society vol. 96–4, p. 298.

I. V.Peidous, R.Sundaresan, E.Quek, Y.K.Leung, M.Beh, (Singapore). 'Impact of Silicon Wafer Material on Dislocation Generation in Local Oxidation'. Silicon Front–end Technology–Materials Processing and Modeling, *Mat.Res. Soc. Symp. Proc.*, vol. 532, (1998) p. 125.

Theory of Dislocations, Second Edition, J.P.Hirth, Krieger Publishing Company, 1992. ISBN–0–89464–617–6. Section 21-2 in section 21, 'Dislocation pileup', on p. 764.

G. Ho, E.Hammerl, R.Stengl, and J.Benedict(IBM, Siemens) 'Dislocation Formation in Trench–Based Dynamic Random Access Memory (DRAM) Chips'. Surface/interface and Stress Effects in Electronic Material Nanostructures, *Mat.Res. Soc. Symp. Proc.* vol. 405, (1996). p. 459.

(List continued on next page.)

*Primary Examiner*—Wael Fahmy
*Assistant Examiner*—Hsien-Ming Lee
(74) *Attorney, Agent, or Firm*—Gray Cary Ware & Freidenrich LLP

(57) ABSTRACT

To reduce dislocations produced in the formation of shallow trench isolation regions in a semiconductor substrate, the semiconductor substrate is annealed in $N_2$ ambient pressure with an $O_2$ partial pressure of less than about $10^{-4}$ at a temperature between about 950 C.° and about 1055 C.°. In addition, a method to reduce crystalline defects in semiconductor manufacturing in which a metal is deposited on an insulator to form metal silicide is provided. The method provides for etching the insulator to create an overhang by an amount equal to at least one half of the thickness of the metal, thereby creating a void between the surface of the semiconductor substrate and the insulator. The metal is deposited on the first insulator and on the surface of the semiconductor substrate and the semiconductor substrate is heated thereby forming metal silicide on the surface of the substrate.

7 Claims, 28 Drawing Sheets

OTHER PUBLICATIONS

J.A. Kittl, Q.Z. Hong, H. Yang, N. Yu, M. Rodder, P.P. Apte, W.T. Shiau, C.P. Chao, T. Breedijk and M.F. Pas (TI). 'Optimization of Ti and Co Self–Aligned Silicide RTP for 0.10□m CMOS'. Advanced Interconnects and Contact Materials and Processes for Future Integrated Circuit, *Mat.Res. Soc. Symp. Proc.* vol. 514, (1998) p. 255.

K. Suguro, T. Iinuma, K. Ohuchi, K. Miyashita, H. Akutsu, H. Yoshimura, Y. Akasaka, K. Nakajima, K. Miyano, and Y. Toyoshima. (Toshiba). 'Silicide Technology in Deep Submicron Regime'. Advanced Interconnects and Contact Materials and Process for Future Integrated Circuits. *Mat. Res. Soc. Symp. Proc.* vol. 514, (1998) p. 171.

B.Z. Li, W.J. Wu, K. Shao, Z.G. Gu, G.B. Jiang, W.N. Huang, H. Fang, Z. Sun, P. Liu, and Z.Y. Zhou. (China) 'Epitaxial Growth of $CoSi_2$/Si Hetero–Structure by Solid State Interaction of Co/Ti/Si Multiyear'. Advanced Metallization for Devices and Circuits–Science, Technology and Manufacturbility, *Mat.Res. Soc. Symp. Proc.* vol. 337, 1994) p. 449.

E.K. Broadbent, A.E. Morgan, J.M. Deblasi, P. van der Putte, A. Reader, B. Coulman, B.J. Burrow, and D.K. Sadana. (Philips).'Growth of Selective Tungsten on Self–aligned Ti and PtNi Silicides by Low Pressure Chemical Vapor Deposition'. *Proceedings of the 1985 Workshop for Tungsten and Other Refractory Metals for VLSI Applications,* (1985), p. 63.

C.Y. Kung, J.M. Liu, W. Hsu, R.H. Horng (Taiwan) 'The Variation of Microstructure in CZ Silicon Induced by Low–High Two Step Anneal'. Crystalline Defects and Contamination: Their Impact and Control in Device Manufacturing 2., *Electorchemical Society Proceedings,* vol. 97–22. (1997) p88.

B. Flink, S. Mui, H. Gottschalk, J. Palm, E.R. Weber. (UC Berkeley) 'Formation of Subthreshold Defects in Erbium Implanted Silicon'. Silicon Front–End Technology–Materials Processing and Modeling, *Mat. Res. Soc. Symp. Proc.* vol. 532, (1998) p. 177.

\* cited by examiner

FIG. 8a
FIG. 8b  $\overline{4\mu m}$

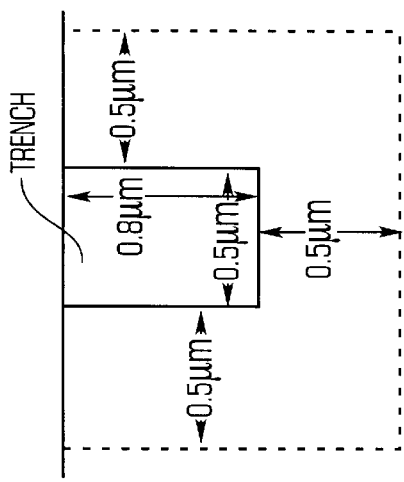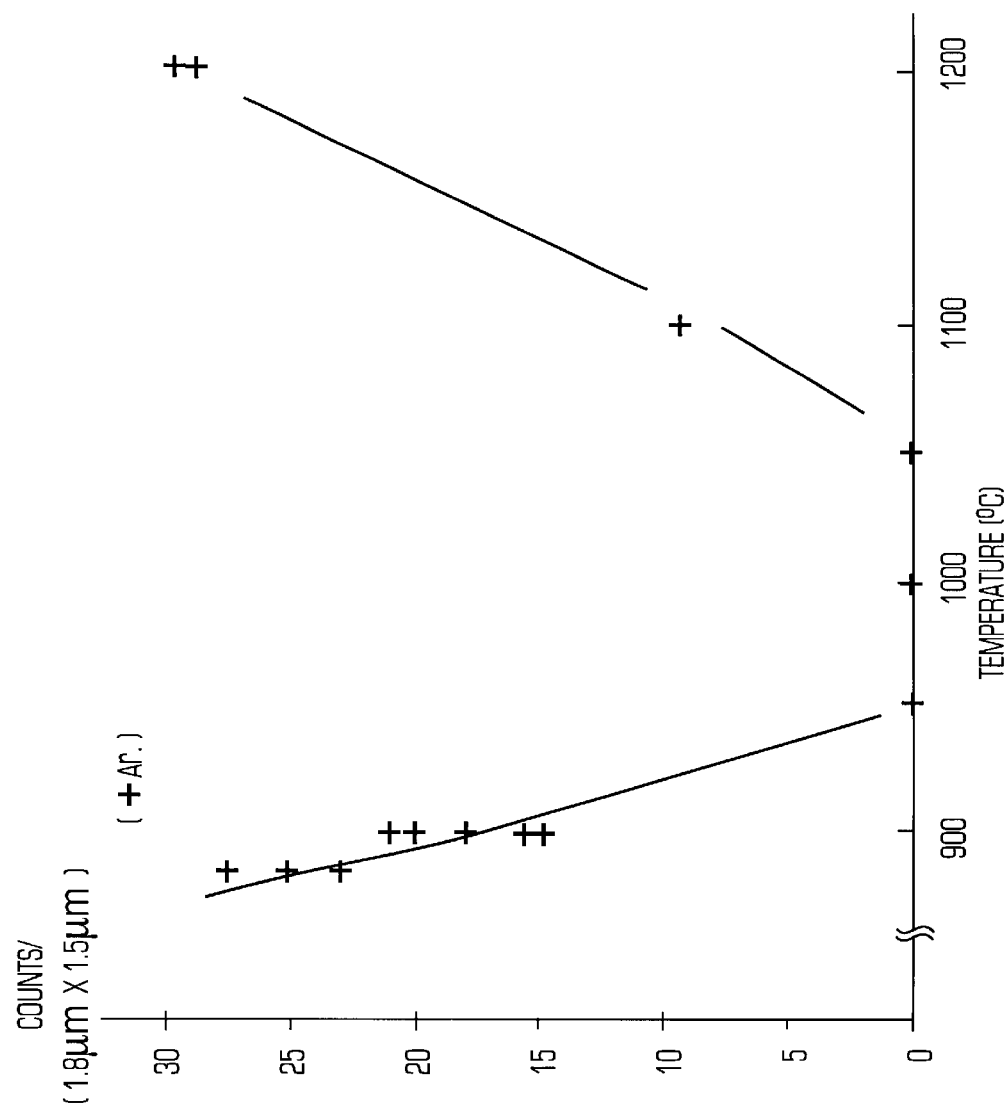
FIG.10

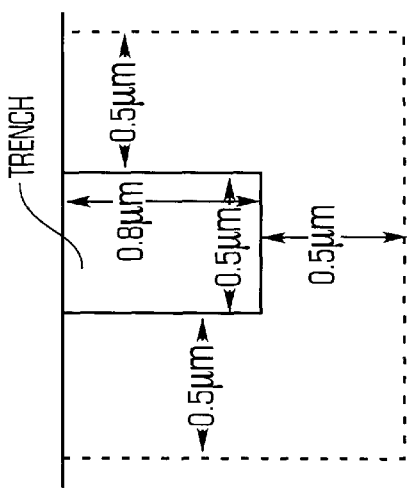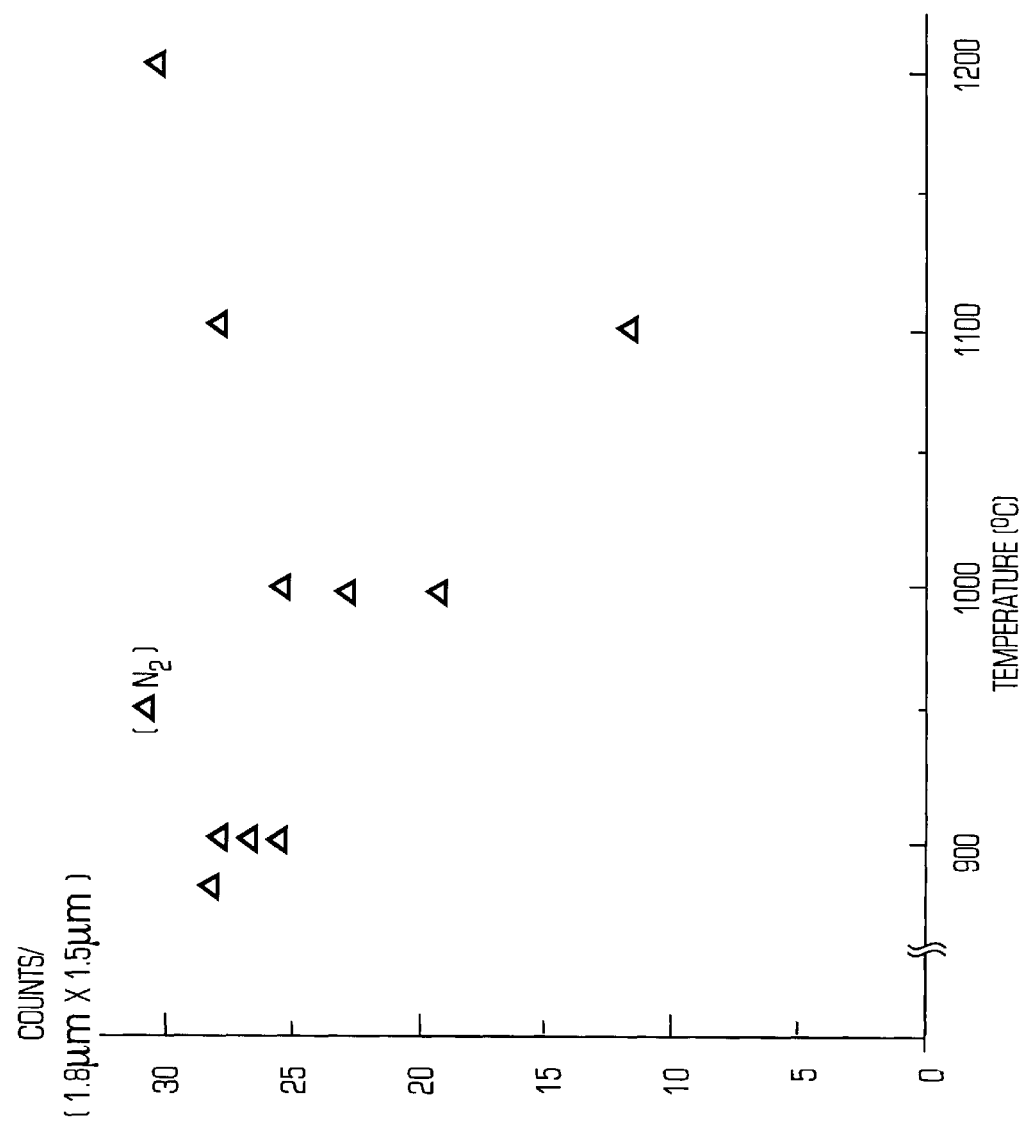
FIG.11

VELOCITY SPACE

REAL SPACE

FIG. 18

| TIME (fs) | VACANCY'S COORDINATES (AVERAGE OF ATOMS IN THE NEXT COLUMN) | | | ATOMS WITH DANGLING BOND (RIGHTMOST * MEANS MORE ATOMS) | | | |
|---|---|---|---|---|---|---|---|
| _____ DIFFUSION OF VACANCY  TEMPERATURE - 1573.00 K _____ | | | | | | | |
| 10.00 | 1.4966E+01 | 1.4952E+01 | 1.7599E+01 | 723 | 734 | 756 | 760 |
| 20.00 | 1.4998E+01 | 1.4967E+01 | 1.7557E+01 | 723 | 734 | 756 | 760 |
| 30.00 | 1.5025E+01 | 1.4975E+01 | 1.7529E+01 | 723 | 734 | 756 | 760 |
| 40.00 | 1.5037E+01 | 1.4960E+01 | 1.7507E+01 | 723 | 734 | 756 | 760 |
| 50.00 | 1.5031E+01 | 1.4912E+01 | 1.7492E+01 | 723 | 734 | 756 | 760 |
| 60.00 | 1.4434E+01 | 1.4394E+01 | 1.7917E+01 | 723 | 734 | 756 | |
| 70.00 | 1.4410E+01 | 1.4330E+01 | 1.7930E+01 | 723 | 734 | 756 | |
| 80.00 | 1.5034E+01 | 1.5089E+01 | 1.8863E+01 | 734 | 756 | | |
| 90.00 | | | | | | | |
| 100.00 | | | | | | | |
| 110.00 | | | | | | | |
| 120.00 | | | | | | | |
| 130.00 | | | | | | | |
| 140.00 | | | | | | | |
| 150.00 | | VACANCY MOVING | | | | | |
| 160.00 | | | | | | | |
| 170.00 | | | | | | | |
| 180.00 | | | | | | | |
| 190.00 | | | | | | | |
| 200.00 | 1.4861E+01 | 1.4661E+01 | 1.6125E+01 | 723 | 760 | | |
| 210.00 | 1.4859E+01 | 1.4710E+01 | 1.6096E+01 | 723 | 760 | | |
| 220.00 | 1.4840E+01 | 1.4756E+01 | 1.6103E+01 | 723 | 760 | | |
| 230.00 | 1.4809E+01 | 1.4800E+01 | 1.6163E+01 | 723 | 760 | | |
| 240.00 | 1.4774E+01 | 1.4844E+01 | 1.6259E+01 | 723 | 760 | | |
| 250.00 | 1.4744E+01 | 1.4898E+01 | 1.6347E+01 | 723 | 760 | | |
| 260.00 | 1.4726E+01 | 1.4967E+01 | 1.6396E+01 | 723 | 760 | | |
| 270.00 | | | | | | | |
| 280.00 | | | | | | | |
| 290.00 | | | | | | | |
| 300.00 | | | | | | | |
| 310.00 | | | | | | | |
| 320.00 | | VACANCY MOVING | | | | | |
| 330.00 | | | | | | | |
| 340.00 | | | | | | | |
| 350.00 | | | | | | | |
| 360.00 | | | | | | | |
| 370.00 | | | | | | | |
| 380.00 | | | | | | | |
| 390.00 | | | | | | | |
| 400.00 | | | | | | | |
| 410.00 | | | | | | | |
| 420.00 | | | | | | | |
| 430.00 | | | | | | | |
| 440.00 | | | | | | | |
| 450.00 | | | | | | | |
| 460.00 | | | | | | | |
| 470.00 | | | | | | | |

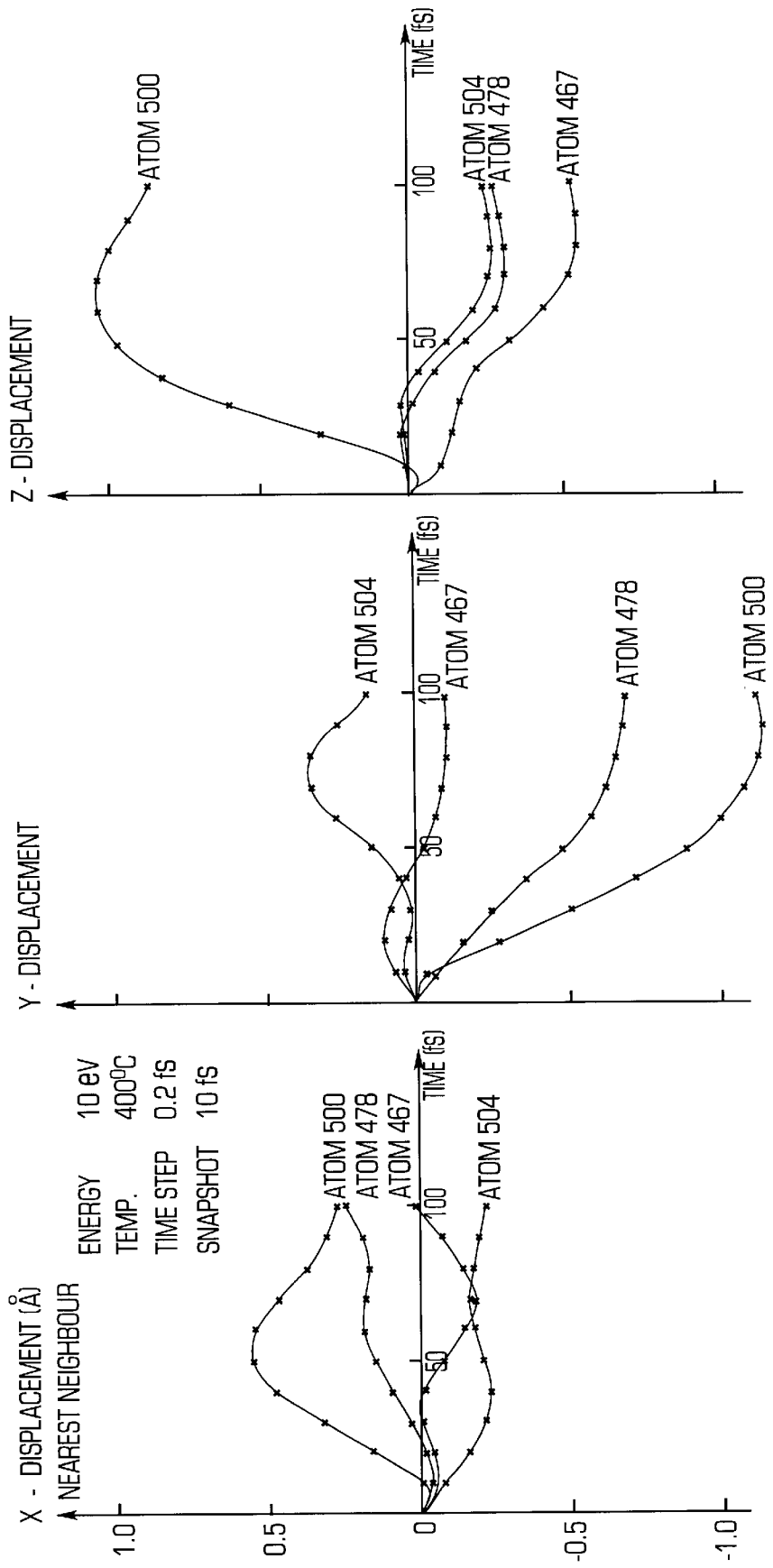

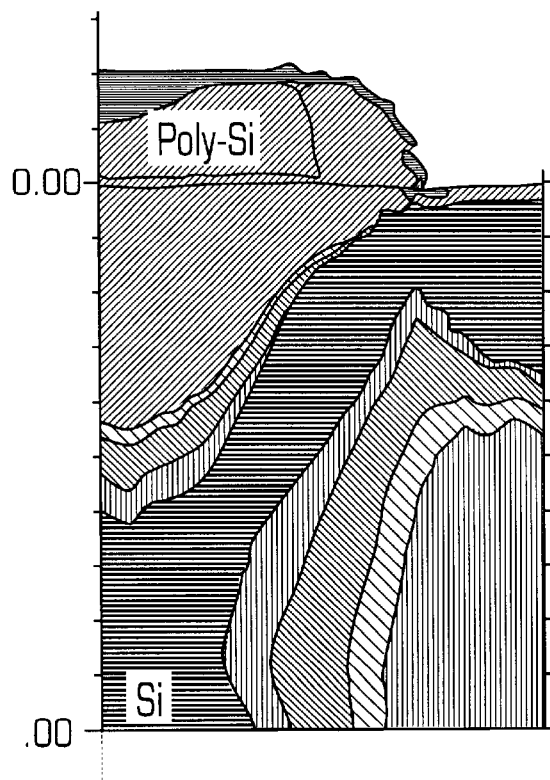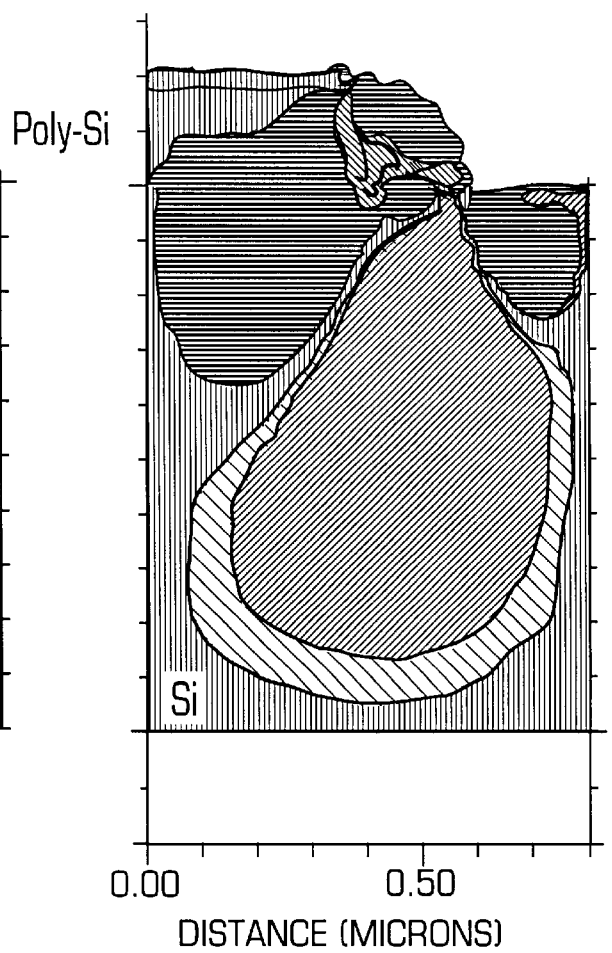
FIG. 34

SEMICONDUCTOR DEVICE MANUFACTURING METHOD TO REDUCE PROCESS INDUCED STRESS AND CRYSTALLINE DEFECTS

BACKGROUND OF THE INVENTION

1. Field of the Invention

The present invention relates to a semiconductor device manufacturing method, and more particularly to a semiconductor device manufacturing method for improving reliability by reducing crystalline defects in scaled devices and process induced stress.

2. Description of the Prior Art

The semiconductor fabrication process has been composed basically of diffusion, silicidation, oxidation, chemical vapor deposition (CVD), ion implantation, etching and so-forth, done repeatedly on semiconductor silicon substrates.

At a scaled geometry of 0.25 $\mu$m or smaller, however, stress and crystalline defects in the silicon substrate and device itself begin to predominate. These stress and crystalline defects play a role in device operation reliability, such as mobility reduction in channel region of MOS devices due to scattering, leakage current in P/N junction, and so-forth. Thus, stress and crystalline defects are very important issue in both process and device designing. Complicating matters is the fact that stress and crystalline defects are 'invisible' and very difficult to detect in fabrication lines. Heretofore, process induced stress and crystalline defects have neither been controlled nor analyzed.

Among a series of LSI processes, RTP(rapid thermal process), RIE(reactive ion etching), shallow trench isolation process, and silicidation have been thought to be primary factors causing crystalline defect. In addition, appearance of crystalline defects has been thought in connection with mechanical strength of Si wafer itself. However, this is still qualitatively discussion.

For high packing density LSI, isolation process which makes devices electrically isolated from each other on a semiconductor chip is one of the key issues. Before a generation of 0.25 $\mu$m-devices, there had been adopted the LOCOS (locally oxidation process) isolation process. However, the LOCOS process requires a large area on the silicon substrate devoted to isolation. This is a serious disadvantage for high density scaled MOS/Bipolar devices, such as 0.25 $\mu$m. Consequently, a new candidate for isolation process has been developed. This is the STI (shallow trench isolation) process The STI process is the ultimate ideal process, because trenches are made between each individual device on silicon substrate, and filled with insulating material. However, for STI there is a problem of the difference in thermal expansion coefficient. Thermal coefficient of Si is of $3.052 \times 10^{-6}$, and that of $SiO_2$ is of $1.206 \times 10^{-7}$. Thus, it can be seen that a large number of stress has been generated due to the difference in thermal expansion coefficients.

Heretofore, some researchers have analyzed the stress distribution around STI in terms of process temperature and materials for filling to some extent. According to the prediction of process simulators, one can modify and optimize the process sequence and structure of STI in advance of actual fabrication. However, since process sequences to suppress dislocation generation are not completely controlled, there are still some important factors remaining.

Reference is made to K. Schonenberg, 'Stability of Size Strained Layers on Small Areas Trench Isolated Silicon Islands', Proceedings of the Fourth International Symposium on Process Physics and Modeling in Semiconductor Technology. Electrochemical Society vol.96–4, p.298. This paper describes efforts to overcome existing problems. FIGS. 1, 2, and 3 herein are reproduced from the paper. FIG. 1 shows a cross section TEM (Transmission Electron Microscope) photo of STI. It can be seen from the photo that most dislocations are observed to be around the corners of the STI. The authors of the paper have focused on the dislocation line on [110]Si direction. Moreover, they said that slip plane was on (111)Si. They speculated dislocation generated due to shear stress on (111)Si plane. In FIG. 3, they reported that dislocation loops were observed. However, the cause of the dislocations was not explained. Thus, it is still difficult to propose modification of process sequence and STI structure to eliminate defects.

Another prior art reference is I. V. Peidous, R. Sundaresan, E. Quek, Y. K. Leung, M. Beh, (Singapore). 'Impact of Silicon Wafer Material on Dislocation Generation in Local Oxidation'. Silicon Front-end Technology-Materials Processing and Modeling, *Mat.Res. Soc. Symp. Proc.*, vol. 532, (1998) p.125. Two typical figures from the paper are reproduced in FIG. 4 and FIG. 5 herein. FIG. 4 shows an optical microscope photo on the top view of the Si chip. FIG. 5 is an optical microscope photo, in which dislocation etch pits have been observed. In this paper, they estimated value of the stress which generate dislocations based on the etch pit spacing. The basic theory for the stress estimation based on etch pit spacing has been well recognized and it is discussed in 'Theory of Dislocations', Second Edition, J. P. Hirth, Krieger Publishing Company, 1992. ISBN-0-89464-617-6. However, they still have difficult to pick up new definite ideas which feedback to process sequence. Moreover, there is still problems remaining unsolved when dislocations are generated. Therefore, as seen from the above, current understanding for stress and dislocation generation has still been in only observation phase and phenomenological discussion phase.

Yet another prior art reference is a discussion of dislocation generation from a view point of device fabrication; G. Ho, E. Hammerl, R. Stengl, and J. Benedict(IBM, Siemens) 'Dislocation Formation in Trench-Based Dynamic Random Access Memory (DRAM) Chips'. Surface/interface and Stress Effects in Electronic Material Nanostructures, *Mat.Res. Soc. Symp. Proc.* vol. 405, (1996). p.459. Some typical figures from the reference are shown in FIGS. 6(*a*), (*b*), (*c*), and (*d*). The authors discussed dislocation generation probability in terms of cell arrays, such as half pitch layout, quarter pitch layout. According to their analysis and discussion, dislocation generation has been found to have strong correlation with cell patterns and layout. Through their discussion and analysis, some of the dislocations have been observed in optimized cell structure. From the sense of reliability of device such as 256MdRAM, 1GdRAM, and more, however, a much more reliant process must be established.

As noted in above, three dimensional process simulators have been now available to estimate distribution of stress generated during oxidation, diffusion and so-forth. In recent years, three dimensional process simulator is one of the tools to estimate structure and stress distribution. This tool is very useful for making process sequence in advance of actual fabrication. However, the output is still not satisfactory. The accuracy is currently around 50%. Therefore, at this moment, the full development of 0.25 $\mu$m device or smaller geometry is still retarded.

Four prior references on the silicidation process are discussed. First is J. A. Kittl, Q. Z. Hong, H. Yang, N. Yu, M. Rodder, P. P. Apte, W. T. Shiau, C. P. Chao, T. Breedijk and M. F. Pas (TI). 'Optimization of Ti and Co Self-Aligned Silicide RTP for 0.10 □m CMOS'. Advanced Interconnects and Contact Materials and Processes for Future Integrated Circuit, *Mat.Res. Soc. Symp. Proc.* vol. 514, (1998) p.255. In this paper, they present studies of Ti and Co salicide processes implemented into a 0.10 μm CMOS technology. The paper focused on morphology and sheet resistively. The paper did not disclose silicidation induced stress distribution nor dislocation.

A second reference is; K. Suguro, T. Iinuma, K. Ohuchi, K. Miyashita, H. Akutsu, H. Yoshimura, Y. Akasaka, K. Nakajima, K. Miyano, and Y. Toyoshima. (Toshiba). 'Silicide Technology in Deep Submicron Regime'. Advanced Interconnects and Contact Materials and Process for Future Integrated Circuits. *Mat.Res. Soc. Symp. Proc.* vol. 514, (1998) p.171. This paper said that silicide technology using cobalt-titanium alloy has been developed for sub-quarter micron devices. They disclosed morphology and sheet resistively in terms of metal selection. Reduction of sheet resistively, is the key issue for propagation delay time in scaled MOS devices around 0.25 μm, smaller. However, the paper did not disclose silicidation induced stress distribution nor dislocation. To suppress the dislocation generation is much more important issue from the sense of reliability of device operation.

A third reference is; B. Z. Li, W. J. Wu, K. Shao, Z. G. Gu, G. B. Jiang, W. N. Huang, H. Fang, Z. Sun, P. Liu, and Z. Y. Zhou. (China) 'Epitaxial Growth of $CoSi_2$/Si Hetero-Structure by Solid State Interaction of Co/Ti/Si Multiyear'. Advanced Metallization for Devices and Circuits-Science, Technology and Manufacturbility, *Mat.Res. Soc. Symp. Proc.* Vol. 337, 1994) p. 449. This paper disclosed that a new method of epitaxial growth of $CoSi_2$ film on Si substrate by ternary solid state interaction is investigated. However, the paper did not disclose silicidation induced stress distribution nor dislocation.

A fourth reference is; E. K. Broadbent, A. E. Morgan, J. M. Deblasi, P. van der Putte, A. Reader, B. Coulman, B. J. Burrow, and D. K. Sadana. (Philips). 'Growth of Selective Tungsten on Self-aligned Ti and PtNi Silicides by Low Pressure Chemical Vapor Deposition'. *Proceedings of the 1985 Workshop for Tungsten and Other Refractory Metals for VLSI Applications,* (1985), p.63. The deposition and material properties of W films selectively deposited on Ti and PtNi silicides by low pressure CVD were investigated. The paper did not disclose silicidation induced stress distribution nor dislocation.

As for the silicon substrate itself, there has been extensive studies on precipitation and segregation characteristics of oxygen dissolved in the substrate from the view point of improvement of thin oxide film grown on it. A state of the art reference is C. Y. Kung, J. M. Liu, W. Hsu, R. H. Horng (Taiwan) 'The Variation of Microstructure in CZ Silicon Induced by Low-High Two Step Anneal'. Crystalline Defects and Contamination: Their Impact and Control in Device Manufacturing 2., *Electrochemical Society Proceedings,* Vol. 97–22. (1997) p88. Another prior art reference is B. Flink, S. Mui, H. Gottschalk, J. Palm, E. R. Weber. (UC Berkeley) 'Formation of Subthreshold Defects in Erbium Implanted Silicon'. Silicon Front-End Technology-Materials Processing and Modeling, *Mat. Res. Soc. Symp. Proc.* Vol. 532, (1998) p.177. FIGS. 7 and 8 herein are TEM photos which are reproduced from these references. The authors discussed only the precipitation characteristics from the view point of thin gate oxide.

As discussed above, around 0.25μm geometry or smaller stress and crystalline defects become more important than before in the silicon substrate and device in itself. These stress and crystalline defects play a role in device operation reliability. Moreover, stress and crystalline defects are 'invisible' and very difficult to detect in fabrication lines.

SUMMARY OF THE INVENTION

Objectives of the present invention are (1)to provide a fabrication method to suppress dislocation generated 'during' LSI fabrication and (2)to provide a fabrication method to minimize dispersion or distribution in device characteristics in scaled devices.

In the first method of the present invention, after making a trench isolation with material filling, silicon substrate is annealed within a specific range of temperature 950–1055C.°, with oxidant or $O_2$ partial pressure less than $10^{-4}$, more desirably, less than $10^{-6}$(1.0 ppm).

In the second method of the present invention, before deposition of metal on single crystal silicon or polysilicon, $SiO_2$ or $Si_3N_4$ is over-etched by an amount of at least on half of the thickness of the said metal.

BRIEF DESCRIPTION OF THE DRAWINGS

FIGS. 8(*a*) and (*b*) are prior art photos of oxygen precipitation in the substrate.

FIG. 10 is a graph showing the number of counts of dislocation as a function of the annealing temperature in accordance with the method of the present invention.

FIG. 11 is a graph showing the number of counts of dislocation as a function of the annealing temperature in accordance with the method of the prior art.

FIG. 18 is a simulation result made using the simulator.

FIG. 19 is a simulation result made using the simulator.

FIG. 34 shows a simulation result using the simulator.

DETAILED DESCRIPTION OF THE EMBODIMENTS

Embodiment 1

A first embodiment of the present invention will be explained in detail with reference to the accompanying drawings. Referring to FIG. 9, there is shown the process of making STI (shallow trench isolation).

Figure 1:
FIG. 1 shows a prior art TEM of trench isolation silicon islands.
Figure 2:
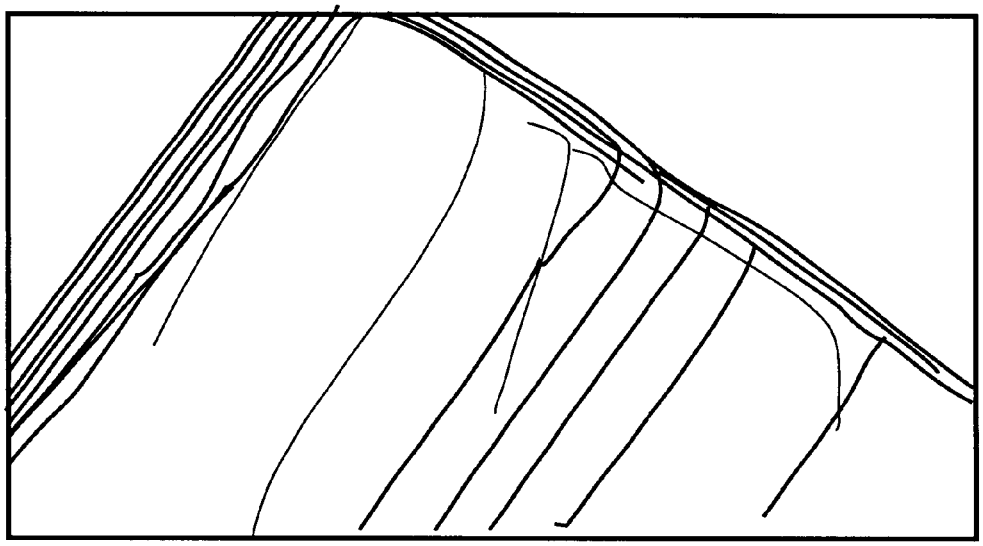
FIG. 2 is another prior art TEM of trench isolation silicon islands.
Figure 3:
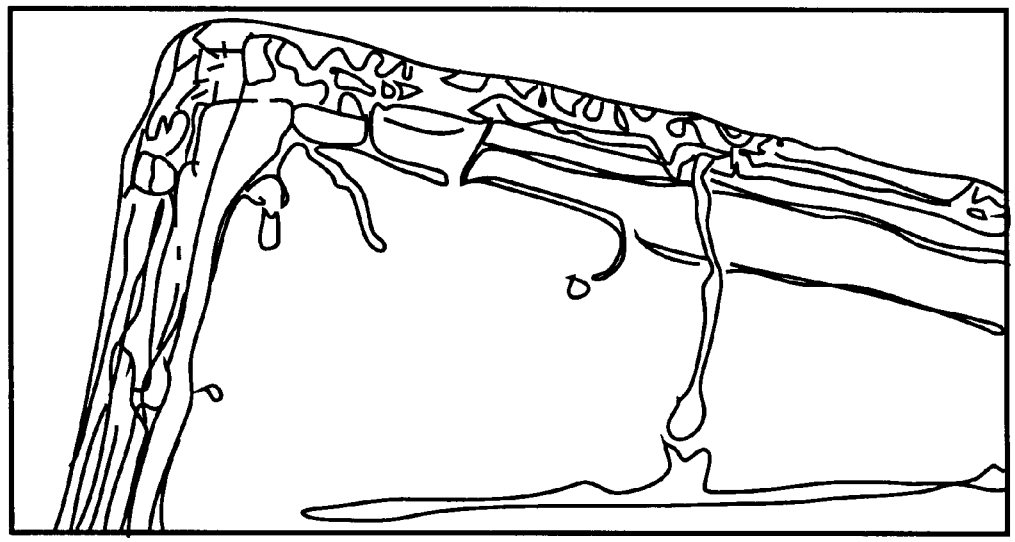
FIG. 3 is a prior art TEM showing dislocation loops.
Figure 4:
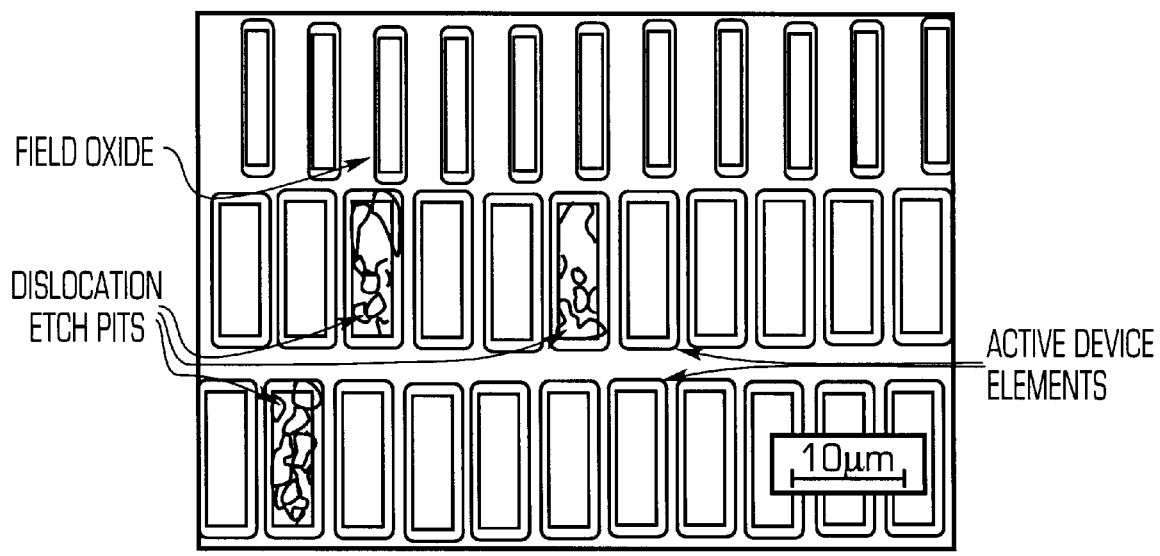
FIG. 4 is a prior art optical microscope photo around edge of LOCOS end.
Figure 5:
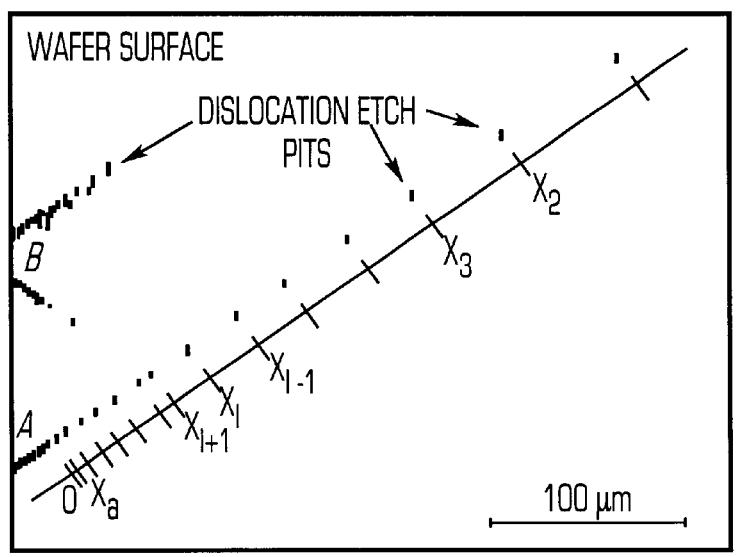
FIG. 5 is a prior art optical microscope photo in which dislocation etch pits have been observed.
Figure 6A:
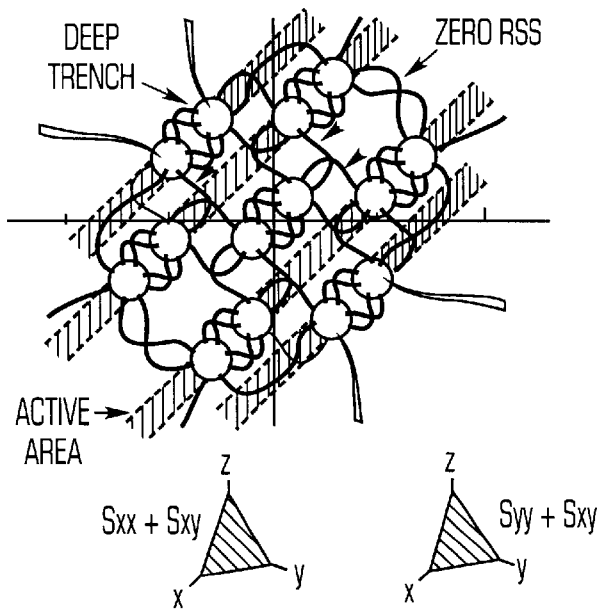
FIGS. 6.(*a*)(*b*)(*c*)(*d*) show dislocation distribution in actual memory cell.
Figure 6B:
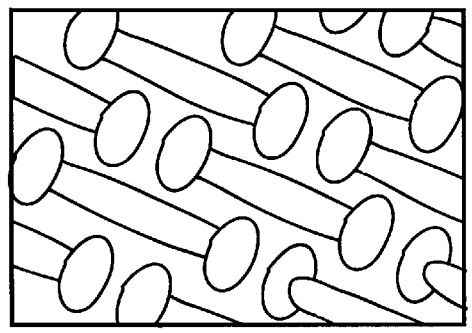
Figure 6C:
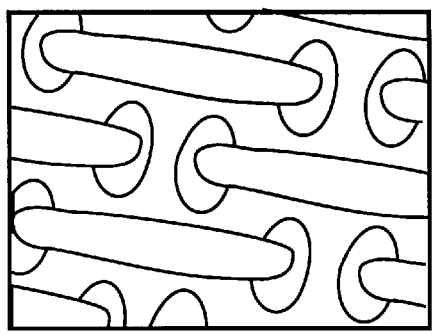
Figure 6D:
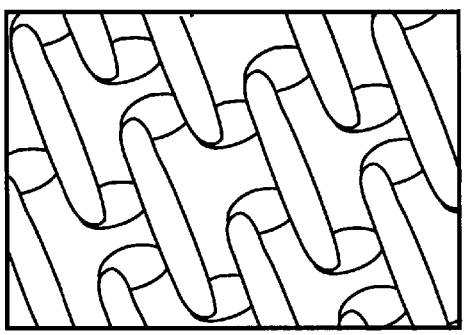
Figure 7:
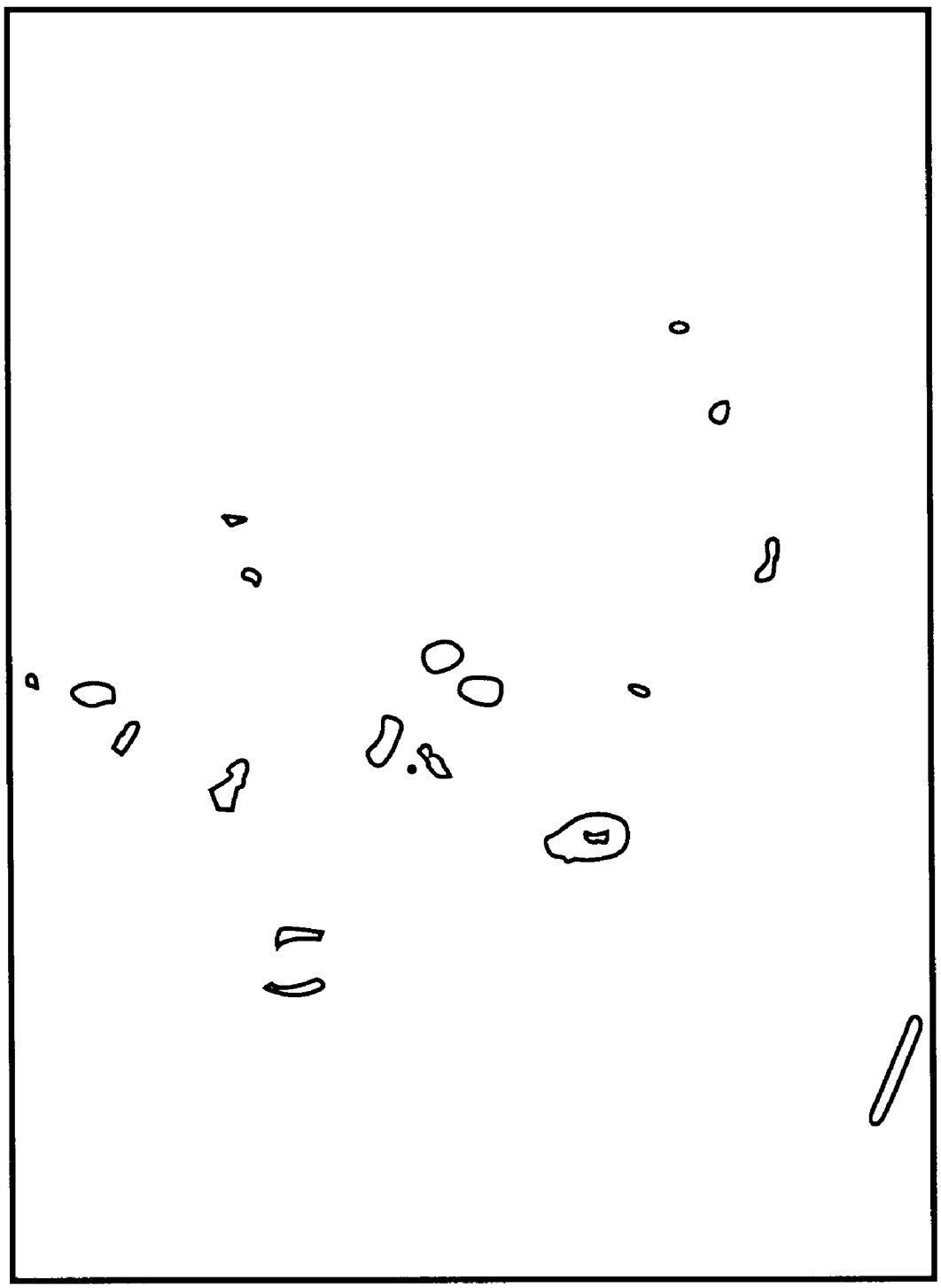
FIG. 7 is a prior art photo of oxygen precipitation in the substrate.
Figure 9A:
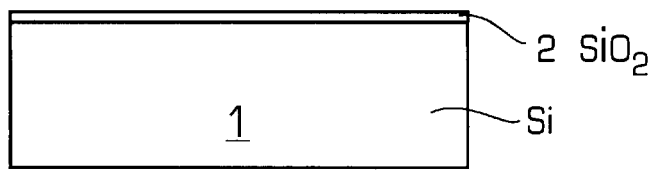
FIG. 9 is a process sequence in accordance with the present invention, to provide a fabrication method to suppress dislocation generation during LSI fabrication and to provide a fabrication method to eliminate dispersion or distribution in device characteristics in scaled devises.
Figure 9B:
Figure 9C:
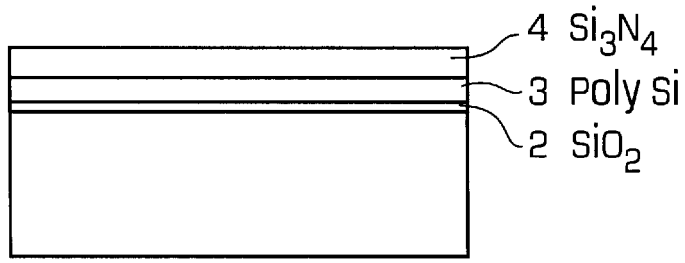
Figure 9D:
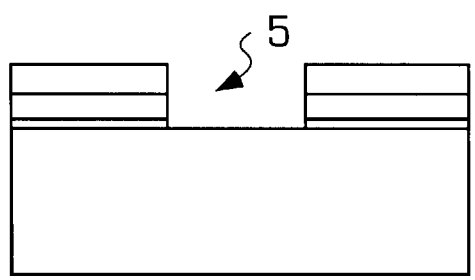
Figure 9E:
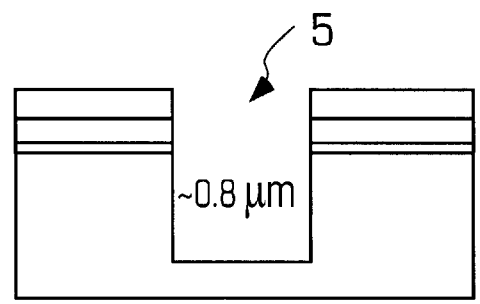
Figure 9F:
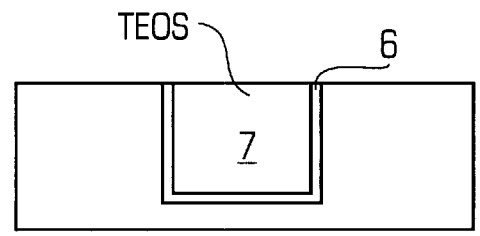

In FIG. 9(a), a pad $SiO_2$ film (2) was grown on a p-type single crystalline substrate 1. The thickness of the pad $SiO_2$ film (2) was of 220 Å. The doping concentration of the Si wafer(1) was $1.4 \times 10^{15}/cm^3$, and the dopant was Boron. Then as shown in FIG. 9(b), polysilicon (3) was deposited on the $SiO_2$ films (2). The film thickness of the polysilicon (3) was 450 Å. The deposition temperature was 625 C.°. After that, as shown in FIG. 9(c) a $Si_3N_4$ film (4) was made by a reduced pressure CVD process on said polysilicon film (3). Typical temperature of deposition of $Si_3N_4$ film (4) was of 650 C.°. Using photo lithography and etching process, a hole (5) was made as shown in FIG. 9(d). Then, Si RIE process was carried, and a trench (5) in FIG. 9(e) was made. Typical depth of the trench was 0.8 μm. After that, the substrate was put into a furnace of oxidation. The temperature was 950 C.°. Thermally grown oxide (6) was grown inside the hole as shown in FIG. 9(f). Then, TEOS (7) (abbreviation of chemical name, a kind of $SiO_2$) was filled into the trench hole as shown in FIG. 9(f). Thus far, the fabrication steps of FIGS. 9(a)–9(f) are conventional and well known.

Figure 9G:
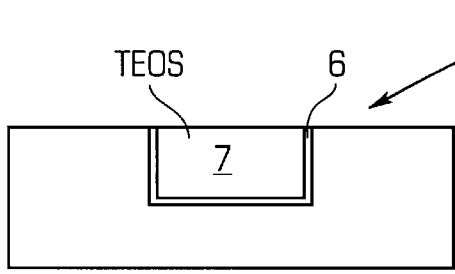

In the conventional process, after the filling material of TEOS fills the trench 5 as shown in FIG. 9(g), the substrate was annealed in $N_2$ ambient around at temperature of 900 C.°. This process was done to strengthen and to vaporize volatile chemicals in TEOS. Thus, in a conventional process, typical annealing temperature ranged from 850 C.° to 95 C.°. In case of a higher temperature, thermal expansion difference factor has been thought to be dominant and plastic deformation has been thought to cause dislocation in the substrate 1. Thus, the typical temperature of annealing in conventional process was 850 C.° to 950 C.°.

Figure 9K:
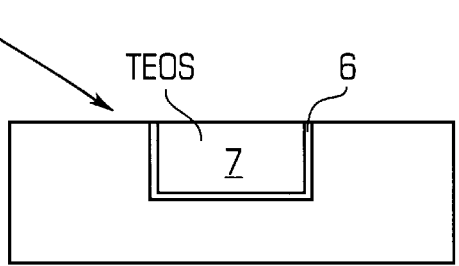
Figure 9H:
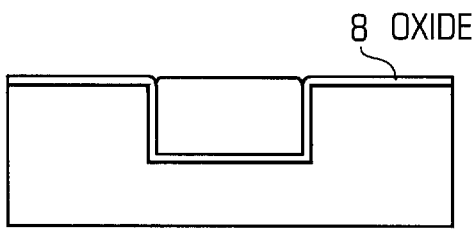

After annealing, some was deposited as shown in FIG. 9(h). Then once the sacrificial oxide (8) was etched off, and the thin gate oxide (9) was grown as shown in FIG. 9(i). The thickness typically was 120 Å. After that, as shown in FIG. 9(j), a device was fabricated. Here the right hand half of the device was shown. The number (10) was polysilicon gate, and the thickness was 2300 Å. The number (11) was $n^+$ diffusion for drain of the device. The number (12) was a passivation film. The number (13) was metalization.

In contrast, to the prior art process, the method of the present invention is set forth in detail using FIGS. 9(k) through 9(n).

After filling a material of TEOS as shown in FIG. 9(g), the substrate 1 was annealed in $N_2$ ambient around at temperature of 1025 C.° in a specific regulated $O_2$ residual partial pressure around $4.3 \times 10^{-6}$ (4.3 ppm).

Figure 9L:
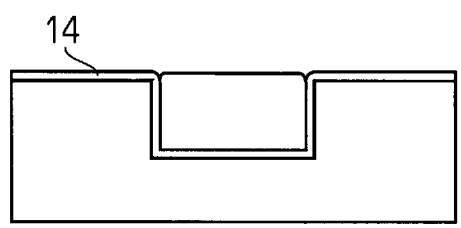
Figure 9I:
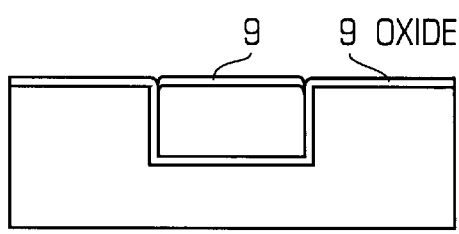
Figure 9M:
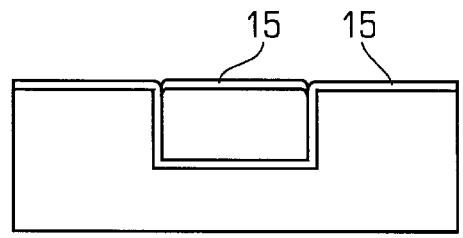
Figure 9J:
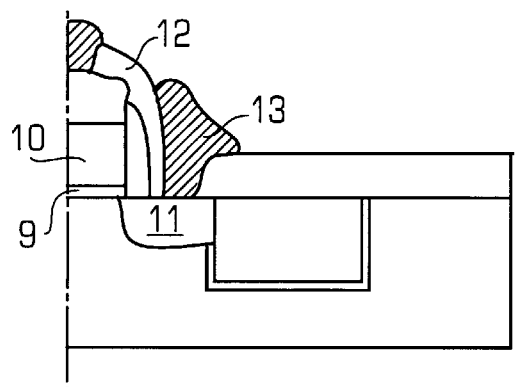
Figure 9N:
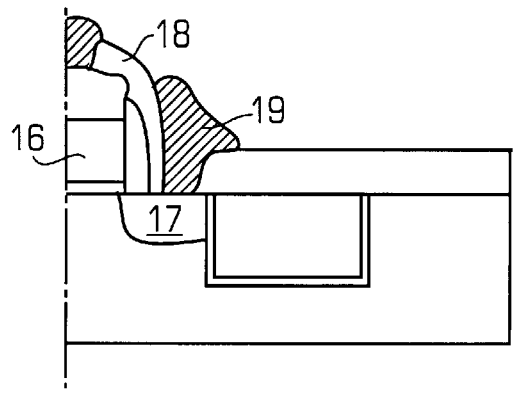

After annealing, oxidation was done as shown in FIG. 9(l). Then the sacrificial oxide (14) was etched off, and the thin gate oxide (15) was grown as shown in FIG. 9(m). The thickness was 116 Å. After that, as shown in FIG. 9(n), a device was fabricated. Here the right hand half of the device was shown. The number (16) was polysilicon gate, and the thickness was 2310 Å. The number (17) was $n^+$ diffusion for drain of the device. The number (18) was a passivation film. The number (19) was metalization.

FIG. 10 shows the experimental results of dislocation measurements for the device of FIG. 9(n) fabricated by the method of the present invention. The measurement procedure was as follows. First, each device was cleaved along the (110) Si plane. Then individual specimen was dipped chemical to decorate dislocation pits on the (110) Si plane. After that each sample was put into an electron microscope. The dislocation density on each sample was measured.

The observed results are shown in FIG. 10. The number of dislocation etch pit was counted in a area just 0.5 μm outside of the trench region as shown in the inset figure in FIG. 10. X-axis show the temperature of annealing as shown in FIG. 9(k). Y-axis represents number of dislocation etch pits in the region. Annealing in $N_2$ ambient was done with a specific regulated $O_2$ residual partial pressure around $4.3 \times 10^{-6}$ (4.3 ppm).

From this figure, it can be seen that dislocation was not detected in the temperature between 950C.° to 1050C.°. The device fabricated in these temperature range were observed having normal $I_d$–$V_g$ characteristics, with normal junction characteristics.

FIG. 11 shows measurement of dislocation density for the device of FIG. 9(j) fabricated by the method of the prior art. From this figure, it is seen that dislocations occur in all temperature regions where only a pure $N_2$ atmosphere is used.

Figure 12:
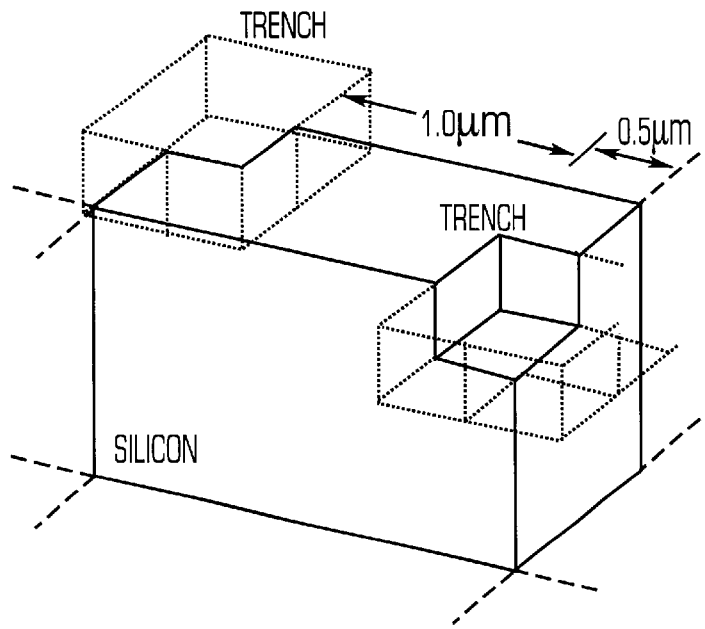
FIG. 12 shows a typical execution area of three dimensional process simulator.

At the current stage, the reason why the method of this invention is effective to suppress the dislocation generation is not understood. However according to the three/two-dimensional process/stress simulator, the stress distribution in terms of trench pattern layout is shown in FIG. 12.

For the convenience of display, two-dimensional process simulator was used herein.

Figure 13A:
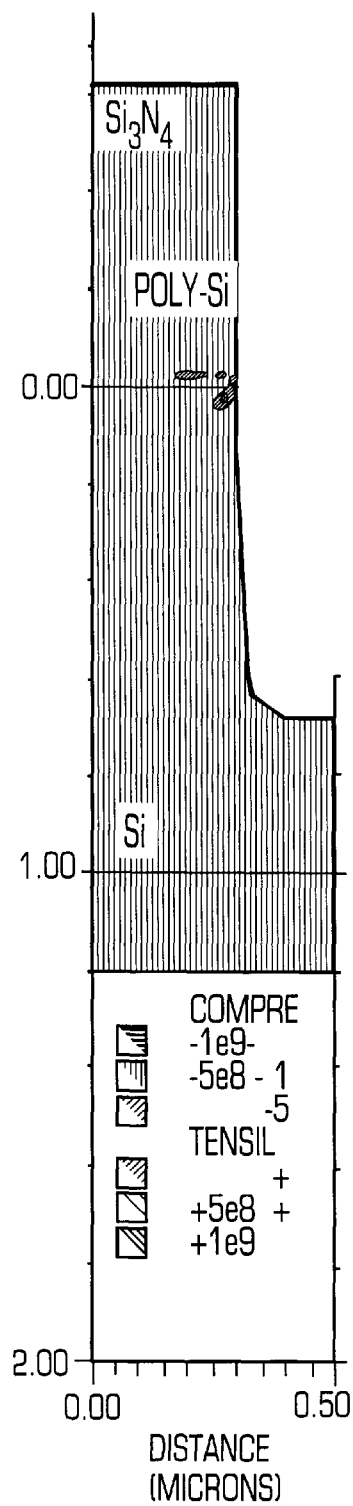
FIG. 13 in an output result of optimized process simulators.

FIG. 13 shows typical output of well-customized two dimensional process simulator. FIG. 13(a) is a stress distribution in trench region at 5 min, 950C.° dry $O_2$ ambient. A warm color represents a tensile stress, and a cold color is compressive stress. From this figure, process-induced stress of dry oxidation at trench corner is only localized within 100 Å. Oxidation induced stress is mainly in proportion to oxidation rate. Therefore, stress decays with oxidation time.

Figure 13B:
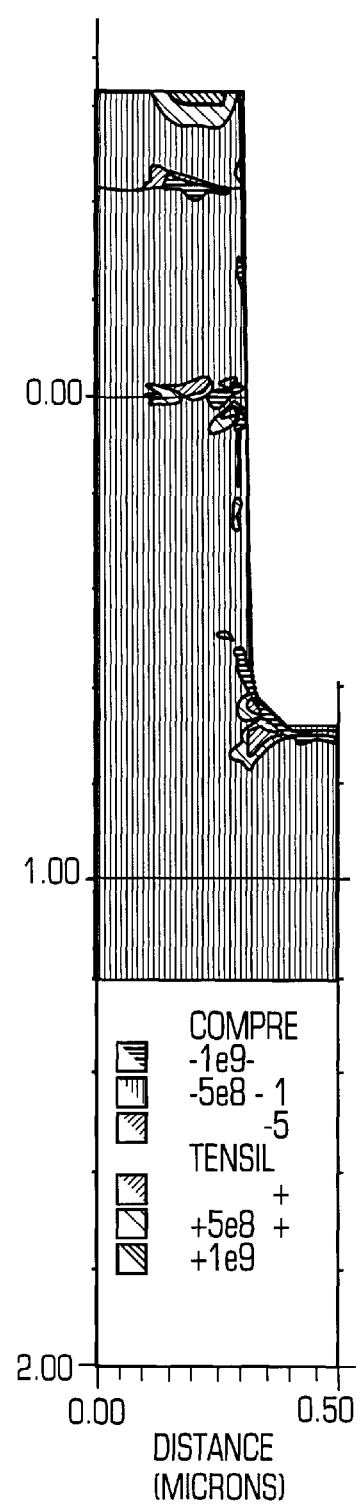

FIG. 13(b) is another output of stress distribution in the trench region. The ambient was wet $O_2$, 950 C.°. Compared with FIG. 13(a), the distribution of stress in FIG. 13(b) is only a little bit wider. Still the distribution of stress is localized.

Therefore, it is quite difficult to understand that oxidation process of trench region will induce a dislocation generation. Moreover, based on the results, we can understand that stress correlation effect between trenches each other is very small.

It is believed that 'correlation between stress field and oxygen interstitial' is responsible for the decrease in the number of dislocations.

To visualize atomistic structure between crystalline Si and crystalline oxide. A single crystal quartz which was specially cut to have an exact surface of (1,−1,0,0) plane was made. It was put into a chamber evacuated down to $10^{-7}$ torr. Then using MBE technology, Si is deposited onto the substrate. The substrate temperature was ranged from 650 C.° to 750 C.°. Crystallinity was monitored using Kikuchi-line analysis. From these experiments, several new results were obtained. (1) deformed lattice region in quartz site was localized only 1 to 2 layers at the $Si/SiO_2$ interface in atomistic sale, whereas (2) in the silicon site at the interface, high density of crystalline defect were spread in a few atomistic scale. Moreover, slight signs of small dislocation 'loops' were found.

From these experimental results, it is believed that when oxygen interstitial gathered and made crystalline oxide, a large amount of stress field were generated especially in silicon site. A simple hand calculation is made. A small balloon of $SiO_2$ in a substrate serves as initial condition. Then, it was expanded. For this simple structure, a value of $4\times10^9$ dyne/cm$^2$ to $5\times10^{10}$ dyne/cm$^2$ was obtained. As shown through experiment of FIG. 10 and FIG. 11, partly precipitated oxygen in the substrate has to be again completely dissolve into substrate at the end of STI process. Thus, in the first method of the present invention, after making a trench isolation with material filling, silicon substrate is annealed within a specific range of temperature 950–1055 C°, with oxidant or $O_2$ partial pressure less than $10^{-4}$, more desirably, less than $10^{-6}$(1.0 ppm).

The theoretical basis of the present invention is based upon the newly developed rigorous molecular dynamic simulator (MD), from which it has been determined that (i) dislocation has rarely been generated in perfect diamond structure, (ii) even with point defects such as vacancy, dislocation has been rarely generated in diamond structure, such as Si, (iii) even with localized energy beam injection into substrate, dislocation has been rarely generated in single crystal Si.

Each of these is explained as follows:

First, it is believed that for Si semiconductor that Tersoff potential is best for such an objective to which the present invention is and i.e., a system which contains dislocation point-defect generation phenomenon. However, a unique improvement to the Tersoff potential for computer simulation was also added thereto mathematically highly strict modifications and derivations. In other words, when the magnitude of the potential is known, forces applied to particles and velocities thereof and so on will be easily found. All potential on i-th Si atom can be expressed based on the uniquely improved Tersoff as follows.

$$\Sigma(1/2)(V_{ij}+V_{ji}) \quad (1)$$

The Tersoff potential which is expanded to MD (molecular dynamics) is to be applied to a force between 3 particles or more, moreover, $V_{ij}$ $V_{ji}$ is in the equation (1). When 'i' denotes the position number of a target Si particle and 'j' denotes another particle number in the vicinity of the particle, the above $V_{ij}$ is written as follows.

$$V_{ij}=f_c(r_{ij})[a_{ij}f_R(r)+b_{ij}f_A(r)] \quad (2)$$

where, 'r' denotes a distance between particles, $f_c(r_{ij})$ is known as cut-off function, $f_R(r_{ij})$ denotes repulsion force, and $f_A(r_{ij})$ denotes attraction force.

Further, $a_{ij}$ is cut-off coefficient when coordination number is taken into account and $b_{ij}$ is also cut-off coefficient when coordination number is taken into account. The improved Tersoff implicitly takes the effect of the force between 3 particles or more into consideration by providing a special parameter to the coordination number in computer code.

Quantities $f_R(r)$ and $f_A(r)$, which are modifications of Morse type potential, are expressed as $$f_R(r)=A\ \exp(-\lambda_1 r)$$

and as $$f_A(r)=-B\ \exp(-\lambda_2 r),$$

respectively, where $\lambda_1$ and $\lambda_2$ are both constants that correspond in magnitude to reciprocals of about inter-atomic distance.

Substituting the $f_R$ and $f_A$ into the equation (2) results in $$V_{ij}=f_c(r_{ij})[a_{ij}A\ \exp(-\lambda_1 r)+b_{ij}(-1)B\ \exp(-\lambda_2 r)]$$

The cut-off function $f_c(r_{ij})$ has the following values. The dimension R is usually selected to include the first adjacent zones alone of a target structure. The value of R is usually 0.2–0.3 nm. Next, the effective coordination number $b_{ij}$ is defined as the following equation (4) using the aforementioned cut-off function, in the improved Tersoff.

$$b_{ij}=(1+\beta^n\zeta_{ij}^n)^{-1/2n} \quad (4)$$

where $$\zeta_{ij}=\Sigma f_c(r_{ik})g(\theta_{ijk})\exp[\lambda^3{}_3(r_{ij}-r_{ik})^3] \quad (5)$$

where $k\neq i,j$. Since $\zeta_{ij}$ is the environmental factor resulting from the input of the third atom 'k', $\zeta_{ij}\neq\zeta_{ji}$. Therefore, $b_{ij}\neq b_{ji}$. Further, as described in equation (1), $V_{ij}\neq V_{ji}$. Furthermore, $g(\theta)$ is a bond angle factor which is written as follows.

$$g(\theta)=1+c^2d^2-c^2/[d^2+(h-\cos\theta)^2] \quad (6)$$

$$a_{ij}=(1+\alpha^n\eta_{ij}^n)^{-1/2n}$$

Before finding $\theta$, $r_{ij}$ is expressed in a rectangular coordinate system, as follows.

$$r_{ij}=[\{(x_j-x_i)^2+(y_j-y_i)^2+(z_j-z_i)^2\}]^{1/2} \quad (7)$$

The factor $r_{ik}$ can be found in the similar manner. Then its inner product $P_{ijk}$ is given as follows.

$$P_{ijk}=(x_j-x_i)(x_k-x_i)+(y_j-y_i)(y_k-y_i)+(z_k-z_i) \quad (8)$$

From these equations, the following equation (9) is obtained.

$$\cos\theta^{ijk}=P_{ijk}/(r_{ij}r_{ik}) \quad (9)$$

where $R=3.0$ Å, $D=0.2$ Å, $A=3264.7$ eV, $B=95.373$ eV, $C=4.8381$, $\lambda_1=3.2394$ Å, $\lambda_2=1.3258$ Å, $\lambda_3=\lambda_4$, (10)

$\beta=0.33675$, $n=22.956$, and $d=2.0417$

From the above preparation, highly strict calculations relating to the calculation of the forces between Si atoms and the calculation of motion velocities were made. When the potential equation (2) is differentiated by position coordinates, the x components of vectors of forces exerted to particles 'i' and 'j' are given by (11) and (12), respectively.

$-(1/2)(\partial V_{ij}/\partial x_i)$ (11)

$-(1/2)(\partial V_{ij}/\partial x_j)$ (12)

However, in actually finding these, the inventors carefully examined the contribution of each variable and prepared a strict higher-order partial differential equation.

Figure 14:
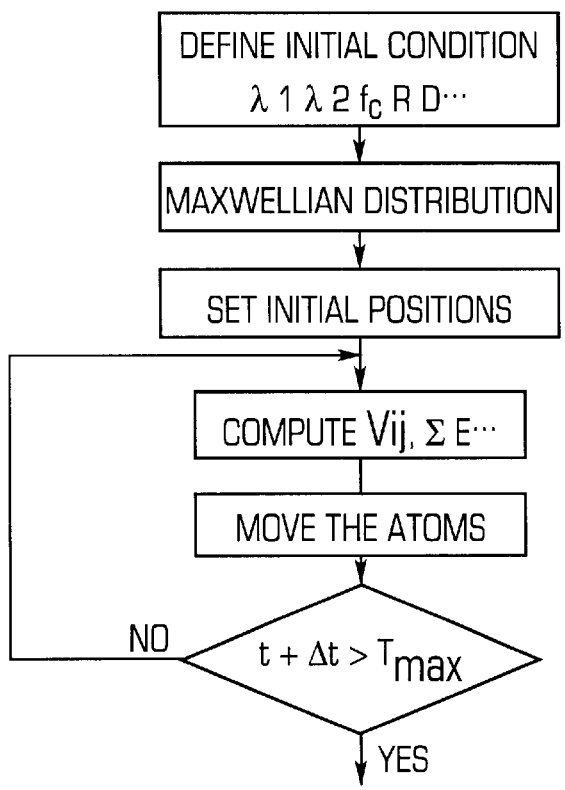
FIG. 14 shows a basic algorithm for molecular dynamics process simulator.
Figure 15:
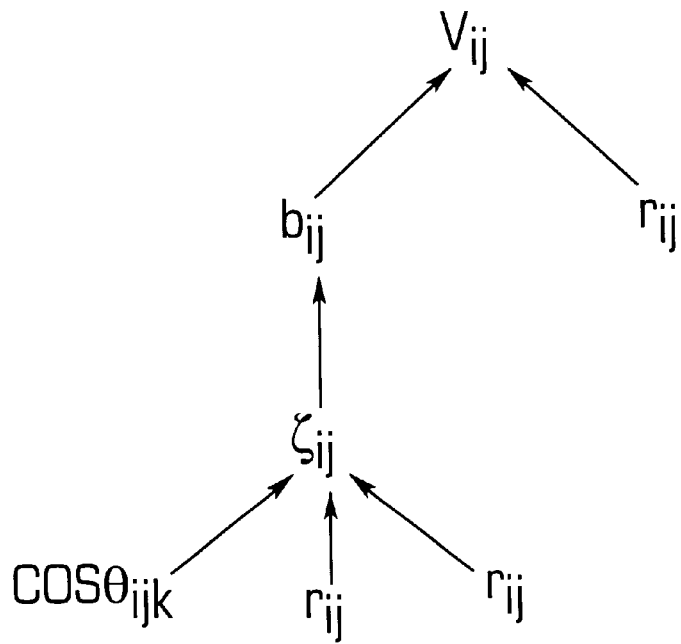
FIG. 15 shows a relationship in valuables of principals and subordinates.
Figure 16:
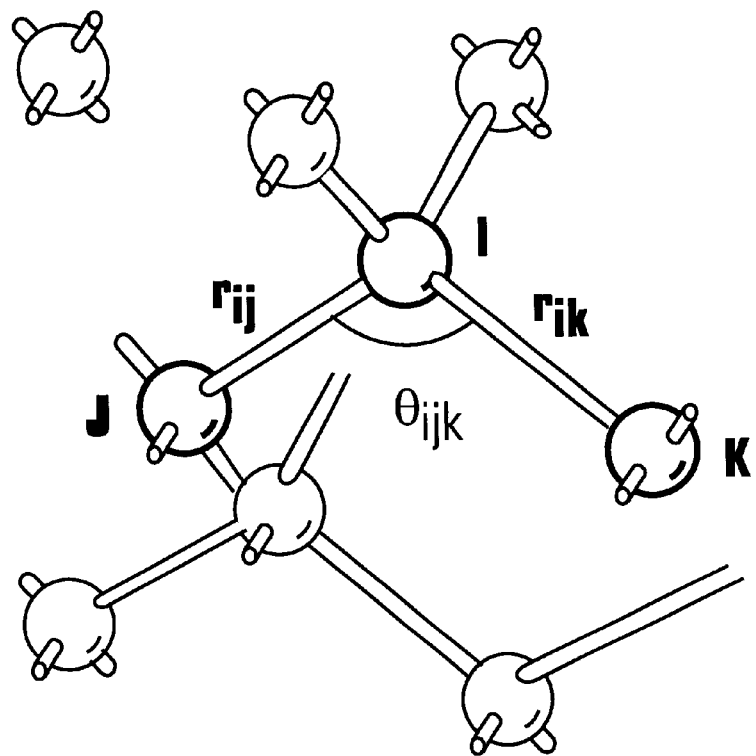
FIG. 16 defines $r_{ij}$, $r_{ik}$, and $2_{ijk}$.
Figure 17A:
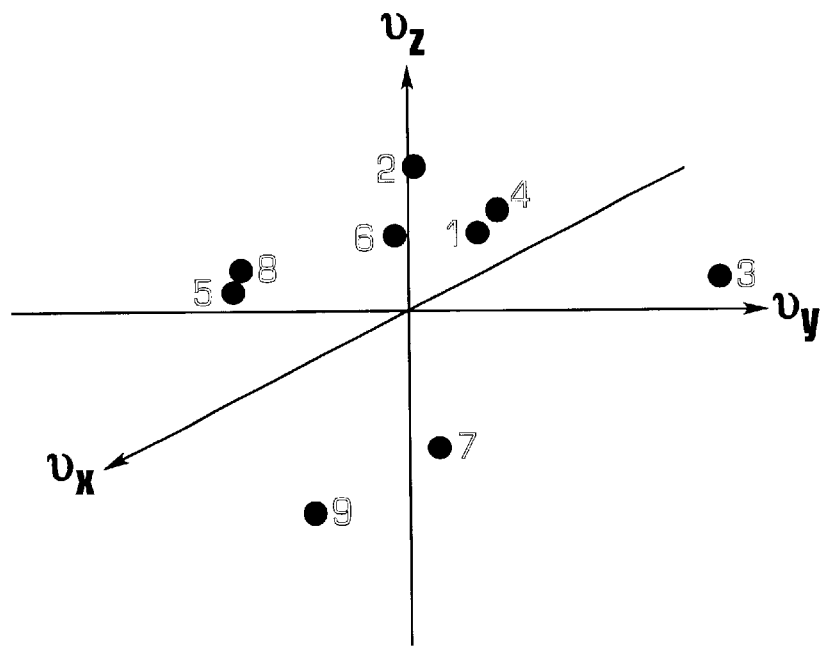
FIG. 17 is an illustration of Maxwellian distribution.
Figure 17B:
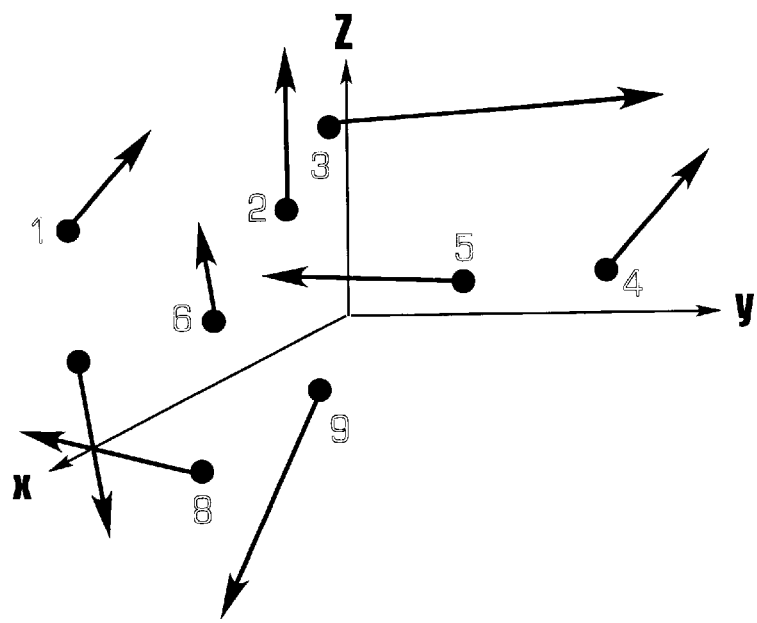

Basic algorithm of MD process simulator is shown in FIG. 14, and relationship in variables of principals and subordinates is shown in FIG. 15, Moreover, definition of some variables is shown in FIG. 16. Moreover, illustration of Maxwellian distribution is shown in FIG. 17.

The values of the components (11) and (12) were found according to the partial differential equation and on the basis of a relationship.

A reduction of the partial differential equation on 'i' is similarly as follows.

$-(1/2)(\partial V_{ij}/\partial x_i)=-(1/2)\{(\partial V_{ij}/\partial r_{ij})(\partial V_{ij}/\partial x_i)+$ $(\partial V_{ij}/\partial \zeta_{ij})[$ $(\partial \zeta_{ij}/\partial r_{ij})(\partial V_{ij}/\partial x_i)+\Sigma(\partial \zeta_{ij}/\partial r_{ij})(\partial r_{ij}/\partial x_i)+$ $\Sigma(\partial \zeta_{ij}/\partial \cos \theta_{ijk})(\partial \cos \theta_{ijk}/\partial x_i)$

] (13)

$-(1/2)(\partial V_{ij}/\partial x_i)=-(1/2)\{(\partial V_{ij}/\partial r_{ij})(\partial V_{ij}/\partial x_i)+$ $(\partial \zeta_{ij}/\partial r_{ij})(\partial V_{ij}/\partial x_i)+$ $\partial \zeta_{ij}/\partial \cos \theta_{ijk})(\partial \cos \theta_{ijk}/\partial x_j)$

] (14)

For easy comparison between the equations (13) and (14), corresponding blank terms were left as they were.

Similarly, a reduction of the partial differential equation on 'k' is as follows. For easy comparison between the equations (13) and (15), corresponding blank terms were left as they were.

When the partial differential equation is actually solved for $V_{ij}$ with use of the equation (2), its result is:

$\partial V_{ij}/\partial r_{ij}=\partial f_c(r_{ij})/\partial r_{ij}[A \exp(-\lambda_1 r_{ij})-b_{ij}B$ $\exp(-\lambda_1 r_{ij})-b_{ij}B \exp(-\lambda_2 r_{ij})]+$ $f_c(r_{ij})[-\lambda_1 A \exp(-\lambda_1 r_{ij})+\lambda_2 b_{ij}B \exp(-\lambda_2 r_{ij})$

)]

$=A \exp(-\lambda_1 r_{ij})*(\partial f_c(r_{ij})/\partial r_{ij}-\lambda_2 f_c(r_{ij}))]-$ $B \exp(-\pi_2 r_{ij})*[\partial f_c(r_{ij})/\partial r_{ij}-\lambda_2 f_c(r_{ij})]b$ ij $\partial f_c(r_{ij})/\partial r_{ij}=-\pi/4D*\cos[\pi/2*(r-D)/D](R-D<r<R+$

D)

$\partial f_c(r_{ij})/\partial \zeta_{ij}=(\partial V_{ij}/\partial b_{ij})*(\partial b_{ij}/\partial \zeta_{ij})=$ $-Bf_c(r_{ij})\exp(\lambda_2 r_{ij})(-1/2n(1+\beta^m \zeta_{ij}^n)^{-1/2n-1}$ $\beta^m \zeta_{ij}^{n-1}=$ $Bf_c(r_{ij})\exp(\lambda_2 r_{ij})b_{ij}(\beta \zeta_{ij})^n/[2\{1+(\beta \zeta_{ij})^n\}$ $\zeta_{ij}]$ $\partial \zeta_{ij}/\partial r_{ij}=3\lambda^3_3 \Sigma f_c(r_{ik})g(\theta_{ijk})\exp(]\lambda^3](r_{ij}$ $-r_{ik})^2$ $\partial \zeta_{ij}/\partial r_{ik}=df_c(r_{ij})/dr_{ij}*g(\theta_{ijk})\exp]\lambda^3_3(r_{ij}-$ $r_{ik})^3]-$ $3\lambda^3_3 f_c(r_{ik})(r_{ij}-r_{ik})^2$ $\partial \zeta_{ij}/\partial \cos \theta_{ijk}=f_c(r_{ik})\exp]\lambda^3_3(r_{ij}-r_{ik})^3]$ $dg(\theta_{ijk}/d \cos \theta_{ijk}$ $f_c(r_{ik})\exp]\lambda^3_3(r_{ij}-r_{ik})^3](2c^2 \cos \theta_{ijk}/\{d$ $^2\cos \theta_{ijk}\}^2](r_{ij}-r_{ijk})^2$ $\partial r_{ij}/\partial x_i=(x_i-x_j)/r_{ij}=\partial r_{ij}/\partial x_j$ $\partial r_{ik}/\partial x_i=(x_j-x_k)/r_{ij}/\partial x_k$ $\partial \cos \theta_{ijk}/\partial x_i=1/(r_{ij}r_{ij})*\partial P_{ijk}/\partial x_{j+}$ $P_{ijk}\{1/(r_{ik})*\partial/\partial x_j[1/(r_{ik})]+$ $1/(r_{ik})*\partial/\partial x_j* 1/(r_{ik})]\}$ $=1/(r_{ik})*(x_i-x_j+x_i x_j)-P_{ijk}\{(x_i x_j)/(r_{ik}$ $r_{ij}^3)+(x_i-x_k)/(r_{ik} r_{ij}^3)=$ $1/(r_{ik})*\}(x_i x_j)/(r_{ij})-(r_{ik})\cos \theta_{ijk}\}$ $\theta \cos \theta_{ijk}/\partial x_j=-1/(r_{ij})*\{(x_i-x_k)/(r_{ik})-(x_i-$ $x_j)/(r_{ik})\cos \theta_{ijk}\}$ $\partial \cos \theta_{ijk}/\partial x_k=-1/(r_{ik})*\{(x_i-x_k/(r_{ik})\cos \theta_{ijk}\}$ The above calculations have been conducted with respect to the x direction. Thus, it is necessary to prepare the corresponding equations with respect to the other y z directions. In this case, 'x' in the above equations can be replaced merely by 'y', or 'z'.

The volume-constant calculation is applied when atoms move in a system but the overall volume of the system is kept constant. The aforementioned technique is based on the volume-constant calculation and thus no special attention is paid to volume change. In the latter case, it is generally necessary to establish a Lagrange's motion equation taking into consideration the internal energy of kinetic energy, potential energy, entropy, volume, etc. The Lagrangian is expressed as follows.

$L(r_i \partial_i/\partial t.\partial V/\partial t.)=1/2\Sigma m(\partial r_i/\partial t)^2-U(r)+1/2M(\partial V/\partial t)^2-P_E V$ where $P_E$ is an external pressure and U is a potential energy. In a pressure-constant calculation, the volume V varies in such a manner that the internal pressure becomes equal to the external pressure. M is virtual mass. The Lagrange's equation is established on the basis of the virtual mass. That is, the following equation is satisfied.

$(\partial L q_j, q'_j)/\partial q_j)-d(\partial L/\partial q'_j)/dt=0$

Calculation is advanced based on this equation. With respect to even this part.

As has been explained above, in the present system, the motions of the respective Si atoms were strictly examined.

Accordingly, although the basic outputs are the position. velocity, force, etc. of each particle with respect to time, various macroscopic factors can be also calculated. As an example, a thermal conductivity can be found. The accuracy and basic operation of the system on the basis of the found thermal conductivity was examined. In this system, further, some device is taken so that single crystal can be handled as finite temperature. In some of the conventional calculation systems, single crystal is handled as absolute zero, which results in that thermal flux becomes infinite and thus thermal conductivity cannot calculated accurately. In order to avoid this, a 'thermal bath' was added to both ends of a crystal to manage the energy transfer therebetween. As a result of the calculation, a value of 180 Watts/meter/Kelvin is obtained. This value seems satisfactory within an error range of about 20% because its usual value is 148–150 Watts/meter/Kelvin in general literatures.

FIG. 18 is a simulation result using the newly developed simulator. One vacancy in periodic of Si crystal with 800 atoms (4×5×5×8=800) was made. Temperature was in 1573 K. The vacancy diffusion and dislocation generation around the point defect is shown in FIG. 18. Through these novel works, dislocation has rarely been generated in perfect diamond structure, and even with point defects such as vacancy, dislocation has been rarely generated in diamond structure.

Figure 21:
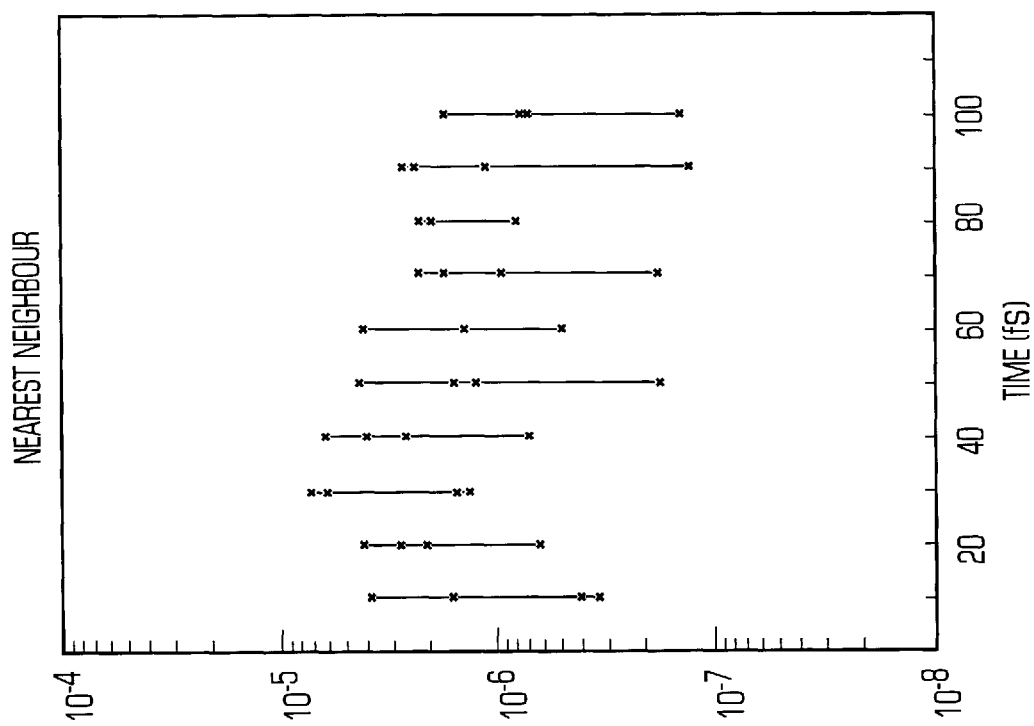
FIG. 21 is a simulation result made using the simulator.
Figure 20:
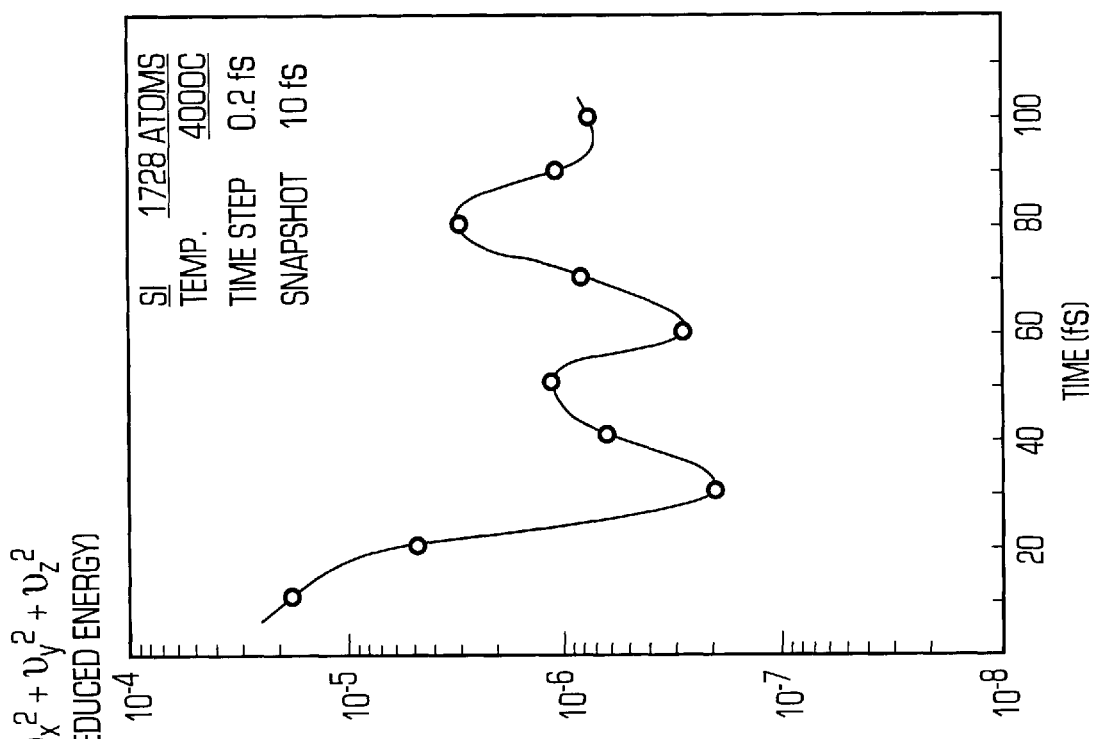
FIG. 20 is a simulation result made using the simulator.

As second step, atomic characteristics in case of localized energy beam injection into substrate was examined. FIG. 19 is a simulation result using the newly developed simulator. FIGS. 19(a), (b), and (c) show atomic displacements as a function of time after injection. FIGS. 20 and 21 give simulation results using the newly developed simulator. X-axis shows a time after injection of localized beam, and y-axis gives us a reduced energy of the atom. Injected energy was simulated to be spread within 50–100 fs into the substrate. It can be seen from these figures that atomic displacements are within 1.0☐ so even with localized energy beam injection into substrate, defects could be rarely generated in single crystal Si.

After correction of extra half plane structure, it was found (i) only around dislocation line of extra half plane, we have still large space; (ii) atoms on both sides of an extra half plane would connected with each other, however, due to thermal agitation, these atoms are repeatedly making bonds and breaking in the same plane, and so on; (iii) around at $4.5 \times 10^9$ dyne/cm$^2$, atoms on the both sides in large space would start to move to connect with each other.

As mentioned above, a single crystal quartz which was specially cut to have an exact surface of (1,−1,0,0) plane was prepared. It was put into a chamber evacuated down to $10^{-7}$ torr. Then using MBE technology, Si was deposited onto the substrate. The substrate temperature was ranged from 650 C.° to 750 C.°. The crystallinity was monitored using Kikuchi-line analysis. From these experiments, several new results were obtained. (1) deformed lattice region of quartz site was localized only 1 to 2 layers at the Si/SiO$_2$ interface in atomistic sale, contrarily to this (2) in the silicon site at the interface, high density of crystalline defect were spread in a few atomistic scale. Moreover, slight signs of small dislocation loops were found.

For a series of novel experiments, newly developed simulator, extensive analyze, and so on, a hypothesis of a small 'not detectable' defect, or 'loop' around SiO$_2$ or some oxygen precipitation region would atomistically growth under stress field was set up.

Figure 22:
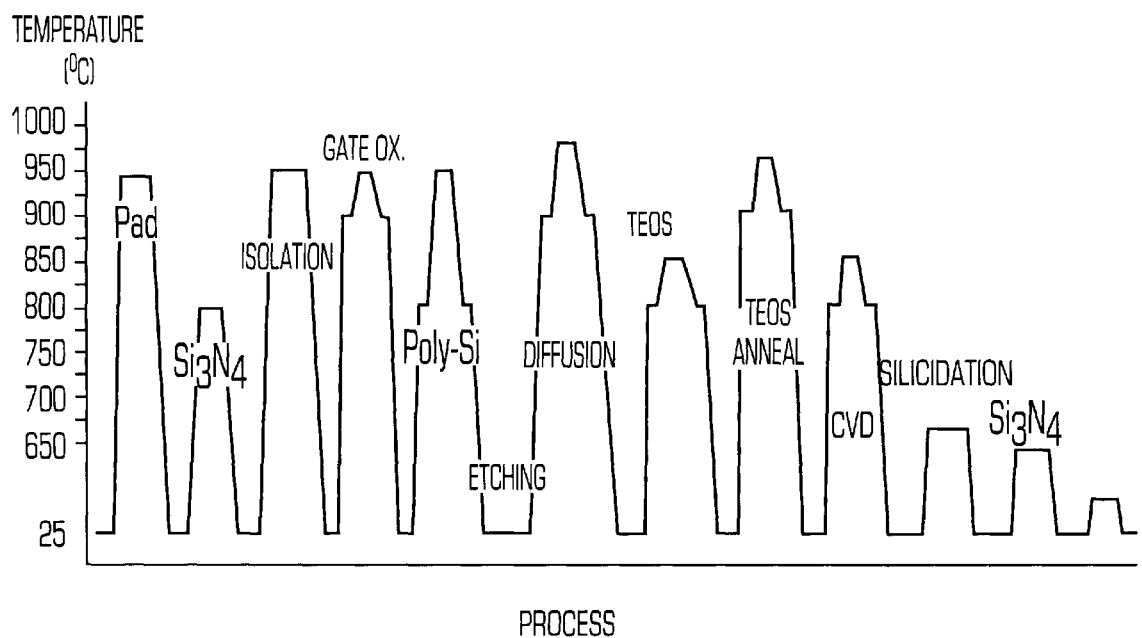
FIG. 22 is a typical process sequence.

FIG. 22 shows a conventional process sequence in LSI device fabrication. From this figure, it can be seen that there are many kinds of temperature sequences. It can be assumed that only tiny oxygen interstitial remaining in substrate would gather each other during heat treatment in stress field. Based on this assumption, FIGS. 9, 10 and 11 show the experiments; partly precipitated oxygen in the substrate has to be again completely dissolve into substrate at the end of STI process, and in the first method of the present invention, after making a trench isolation with material filling, silicon substrate is annealed within a specific range of temperature 950–1055 C.°. with oxidant or O$_2$ partial pressure less than 10 , more desirably, less than $10^{-6}$(1.0 ppm). The present invention has been understood very effective to suppress dislocation generation/growth.

Embodiment 2

A second embodiment of the method of present invention is explained in detail with reference to the accompanying drawings.

As has been explained in above, morphology improvements and reduction of sheet resistively are one of important key issues in scaled MOS devices around 0.25 $\mu$m, or smaller from a view point of propagation delay time improvements and reduction of power. Intensive efforts for morphology improvements and sheet resistively reduction in terms of metal selection have been started. However, as has been examined above, no reference discloses silicidation induced stress distribution nor dislocation.

It is believed that to suppress dislocation generation and to reduce silicidation induced stress is more important issue from a sense of reliability of device operation.

Figure 23:
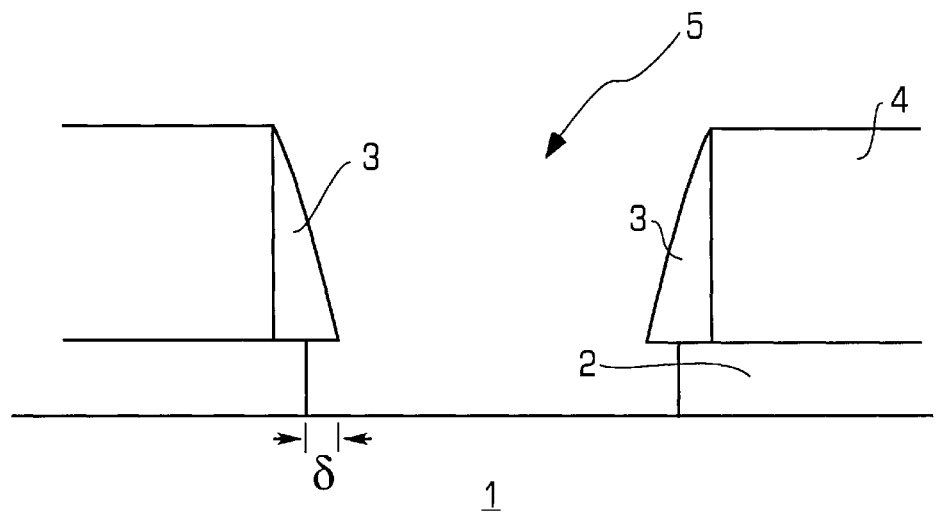
FIG. 23 is a process sequence to provide a fabrication method to eliminate dispersion or distribution in device characteristics in scaled devices.

FIG. 23 is an illustration of a basic idea of a second method of this invention. The part (1) in the figure is a silicon substrate, and thin film (2) is SiO$_2$. Sidewall (3) is made of Si$_3$N$_4$ in this example. A film (4) is another SiO$_2$. When a hole (5) is made, an overhang in (3) is formed as shown in the figure. After that, a metal can be deposited, creating a buffer zone or 'reservoir' of silicidation induced stress.

FIG. 24 is a typical conventional process of 0.25 $\mu$m rule device.

Figure 24A:
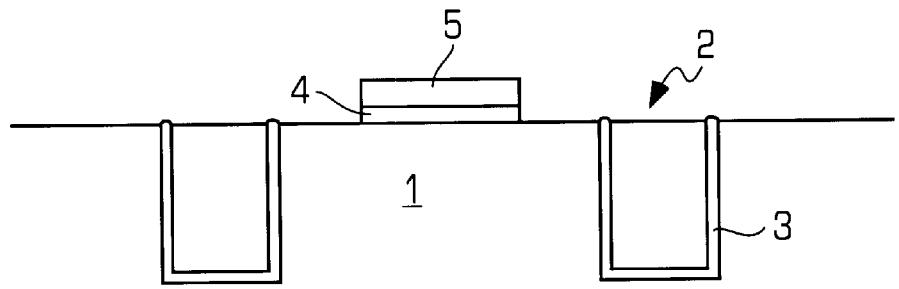
FIG. 24 is a typical prior art process sequence.

As shown in FIG. 24(a), the doping concentration of the Si wafer (1) was $1.4 \times 10^{15}$/cm$^3$, and the dopant was boron in this embodiment. A trench region (2) with depth of 0.8 $\mu$m as shown in FIG. 24(a) is made. After growth of SiO$_2$ film (3) in the trench sidewall, gate oxide was grown and polysilicon film was deposited on it. The gate oxide was of 121 Å in this example. After making gate oxide and polysilicon deposition, using photo-lithography process, the gate oxide (4) and polysilicon (5) can be defined.

Figure 24B:
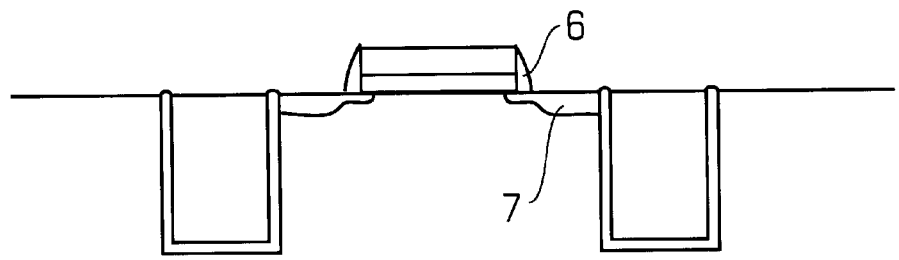
Figure 24C:
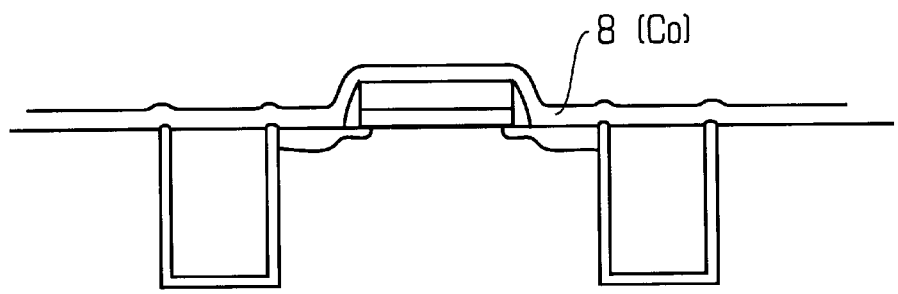
Figure 24D:
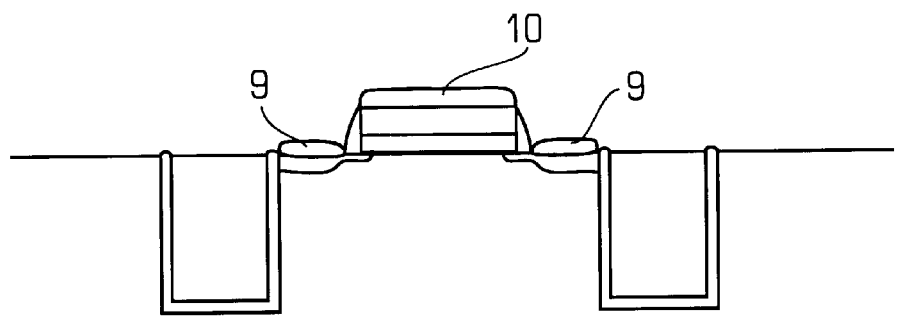

After that, according to conventional process sequence, SiO$_2$ film was deposited. The thickness was of 2540 Å in this example. Then using an anisotropic etching of the oxide, sidewall (6) was made as shown in FIG. 24(b). After that, n$^+$ region (7) was made by ion implantation of arsenic. Then cobalt metal (8) was deposited by sputtering method as shown in FIG. 24(c). After that, silicidation process was done, and then low resistivety contact regions of source/drain (9) and gate (10) were made.

Figure 25:
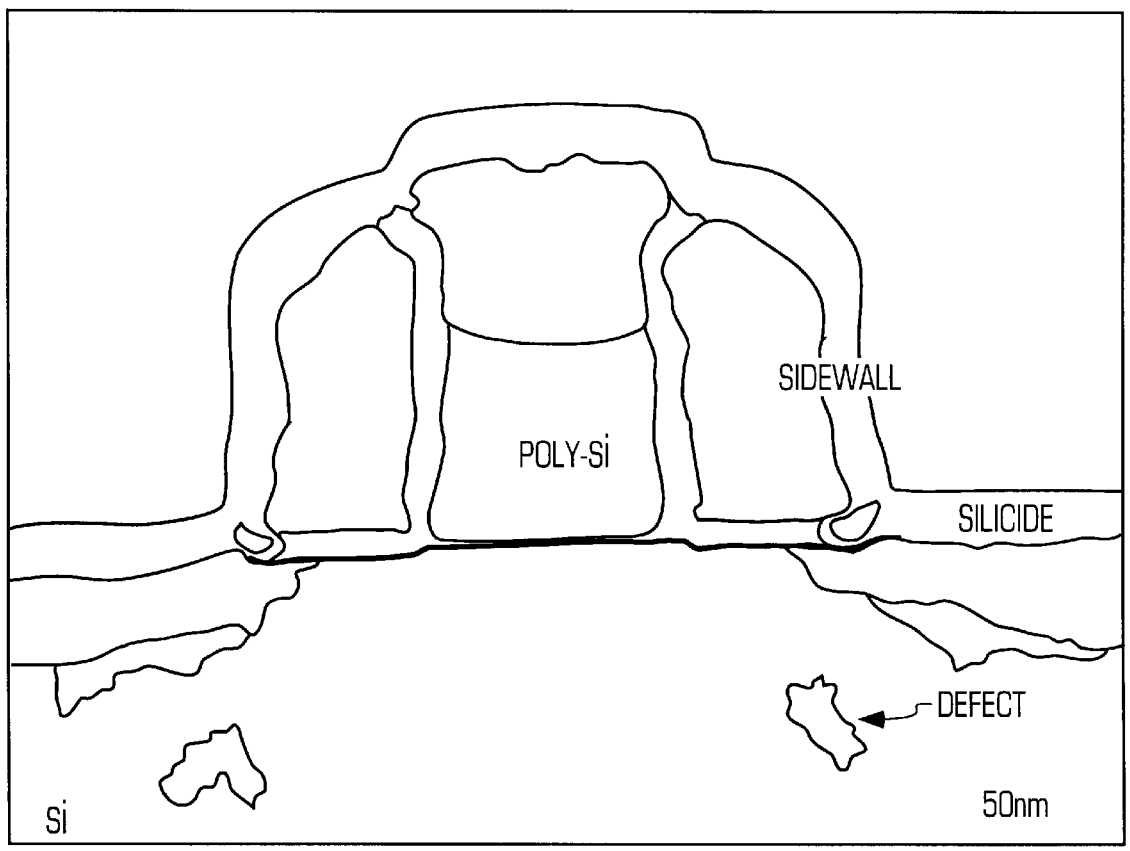
FIG. 25 shows defects in the silicon of the structural made by the process sequence of FIG. 24.
Figure 26:
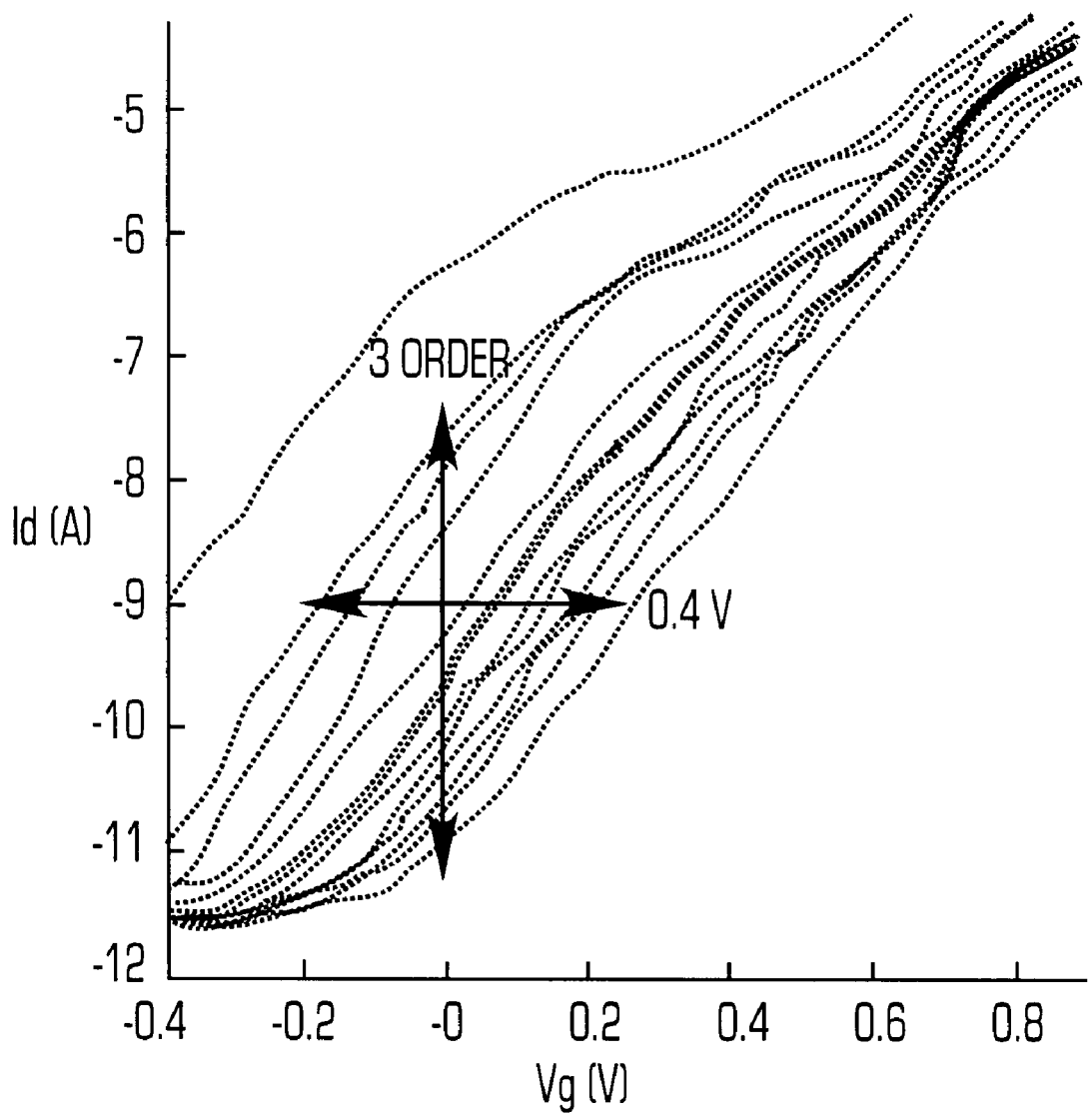
FIG. 26 is an experimental result showing variations in a device fabricated with the method of prior art.

FIG. 25 shows the typical experimental result of TEM observation. From this figure, it can be seen that thin gate oxide region was very smooth. However, source/drain region morphology was not good. Moreover, beneath the gate region, it should be noted that there are some dislocations. FIG. 26 shows Id–Vg characteristics of large amount of transistors fabricated conventional process. There is a large distribution of Id–vg curves. For instance, as indicated in the figure, there is a width of 0.4V in distribution.

Figure 27:
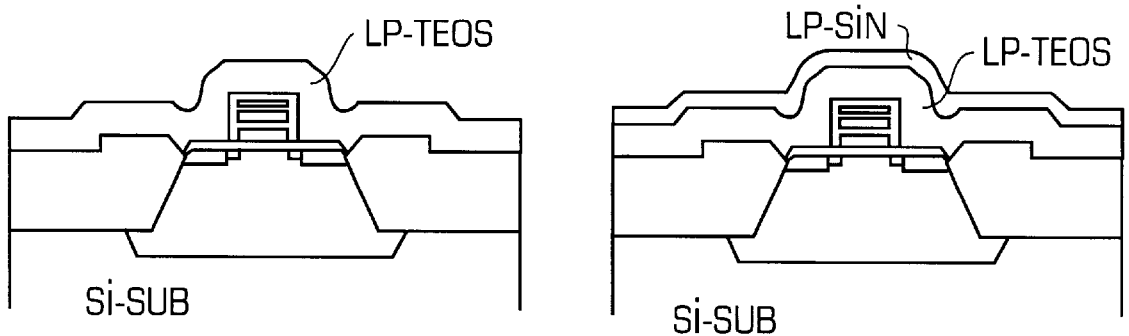
FIG. 27 shows an experiment to isolate defects.
Figure 28:
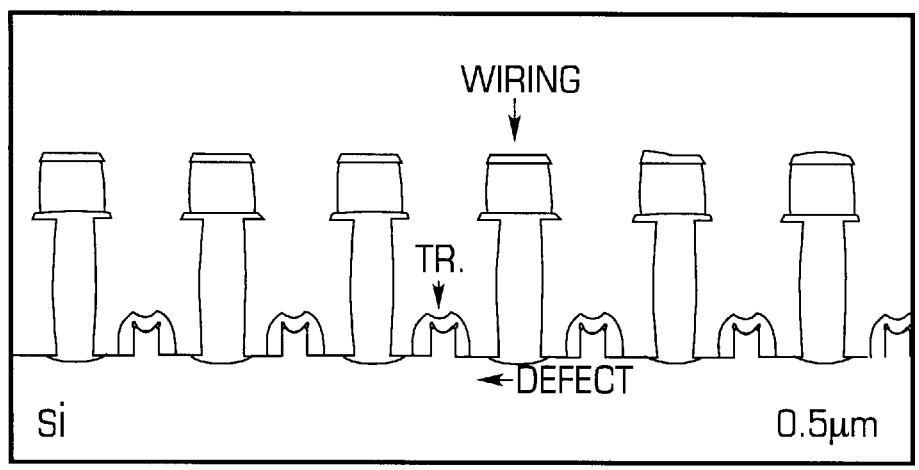
FIG. 28 is an experimental result of the process of FIG. 27.
Figure 29A:
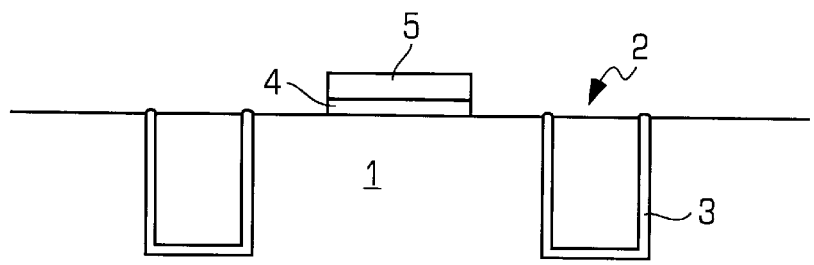
FIG. 29 shows a process sequence to provide a fabrication method to eliminate dispersion or distribution in device characteristics in scaled devises.
Figure 29B:
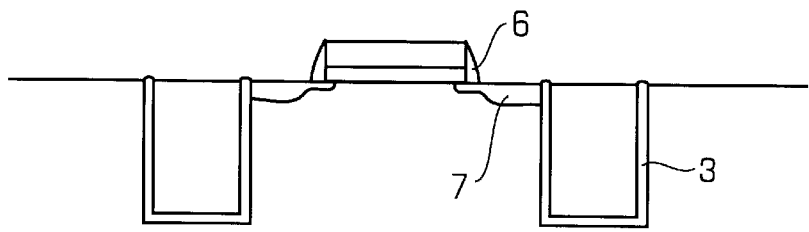
Figure 29C:
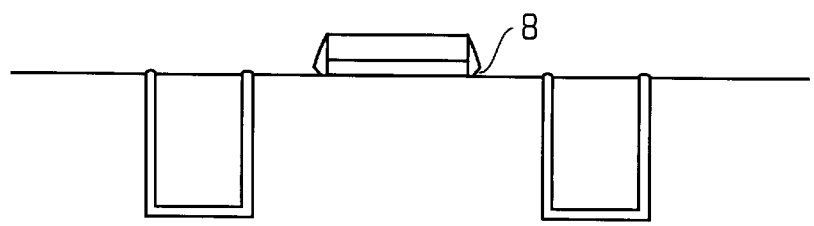
Figure 29D:
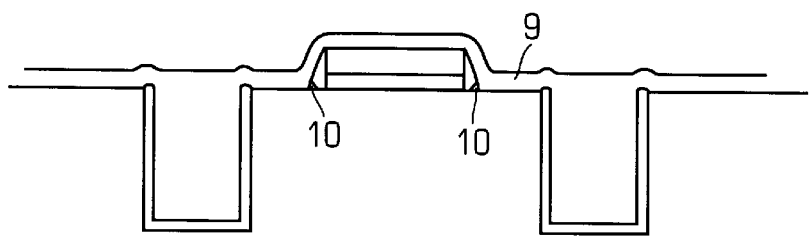
Figure 29E:
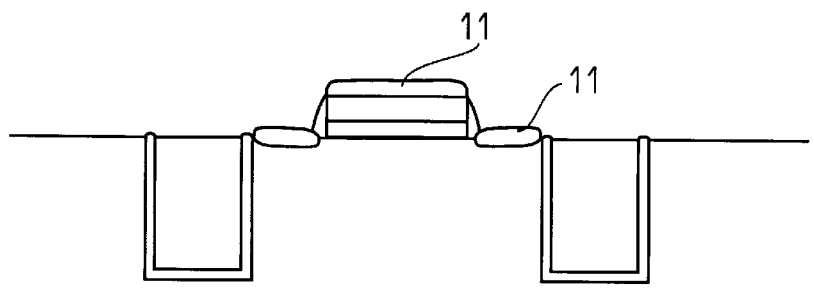

FIG. 27 shows an experiment which was made. Some of devices were covered with LP—Si$_3$N$_4$ for passivation. Especially for L—$Si_3N_4$ film, there has been observed large stress to device area, because LP—$Si_3N_4$ film has a large intrinsic stress. FIG. 28 is another experimental result which was also made. The experiment shows that crystalline defects has not been generated before deposition of LP—$Si_3N_4$ film. Defects in the substrate are shown in FIG. 28 at the end of fabrication.

According to the second method of the invention, FIG. 29 shows a process sequence to provide a fabrication method to eliminate dispersion or distribution in device characteristics in scaled devices. As shown in FIG. 29(a), a trench (2) in a substrate (1) is made. Then, an oxide (3) coating inside the trench is made. After that, a thin gate oxide (4) and polysilicon (5) are deposited. As shown in FIG. 29(b), sidewall 6 using a LP—$Si_3N_4$ film is made. Then S/D regions (7) are made. After that, based on the second method of the present invention, a buffer zone (8) or 'reservoir'(8) for silicidation induced stress is made. The buffer zone 8 is equal to at least one-half of the thickness of the metal. The buffer zone 8 is an undercut in the sidewall 6. Then a metal (9) is deposited on it as shown FIG. 29(d). Then we had a silicidation process. The materials (11) is silicide.

Figure 30:
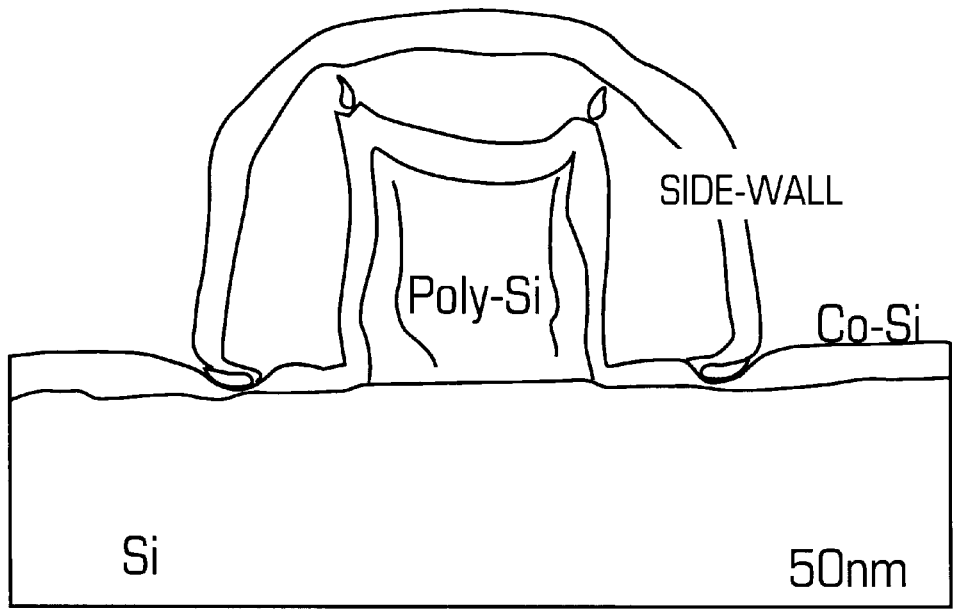
FIG. 30 is an experimental result showing defects, or lack thereof, in a structure made by the process sequence of FIG. 29.
Figure 31:
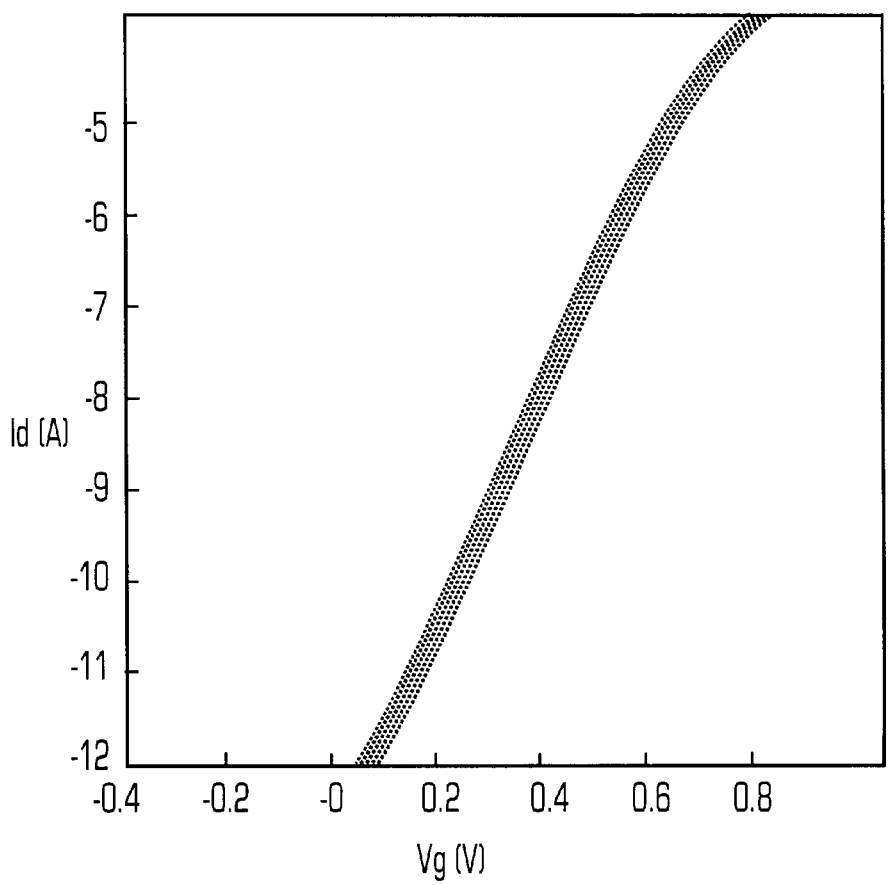
FIG. 31 is an experimental result showing variations in a device fabricated with the method of the present invention.

FIG. 30 is a cross-sectional view of a device fabricated in accordance with the method of the present invention. As can be seen in FIG. 30, morphology has been definitely improved. Moreover, there is no crystalline defects in the substrate. Further, as shown in FIG. 31, the distribution of electrical characteristics is improved.

Figure 32:
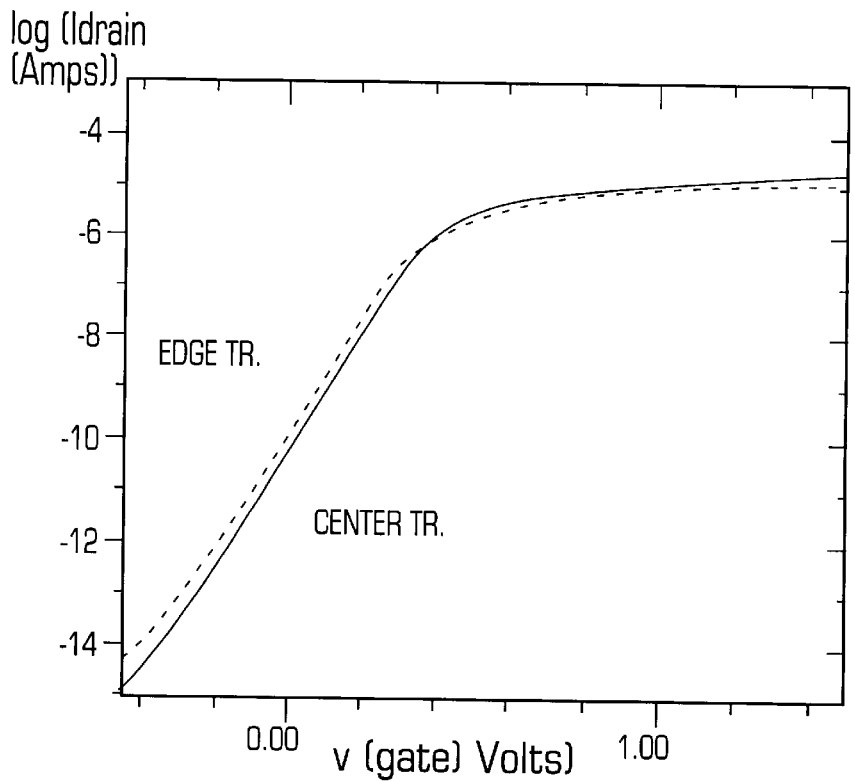
FIG. 32 is a simulation result using the simulator.
Figure 33:
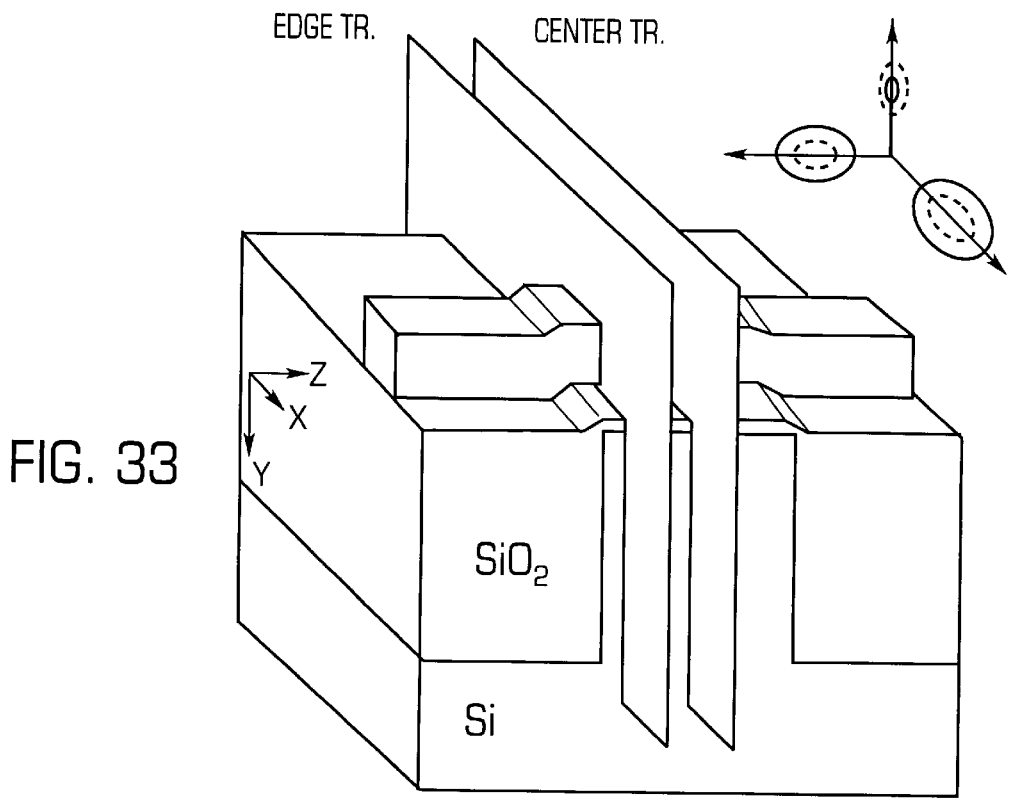
FIG. 33 is an execution area of the device simulator.

The theoretical basis of the present invention may be understood by reference to the three/two dimension process/stress simulator shown in FIGS. 32 and 33.

First, for the convenience of discussion, new two-dimensional specially optimized device simulator was used herein. FIG. 33 shows illustration of 2-dimensional transistor. The edge transistor has a specially deformed electron population as shown in FIG. 33 in n-channel device. The edge transistor has small mobility compared to the center transistor. FIG. 32 shows the only contribution of band deformation due to residual stress. Moreover, around the edge transistor, they will have another peripheral effect; concentration of electric field at the edge, so, inversion layer would first be made compared to center part. Therefore, there will be a distribution in electrical characteristics.

Figure 35B:
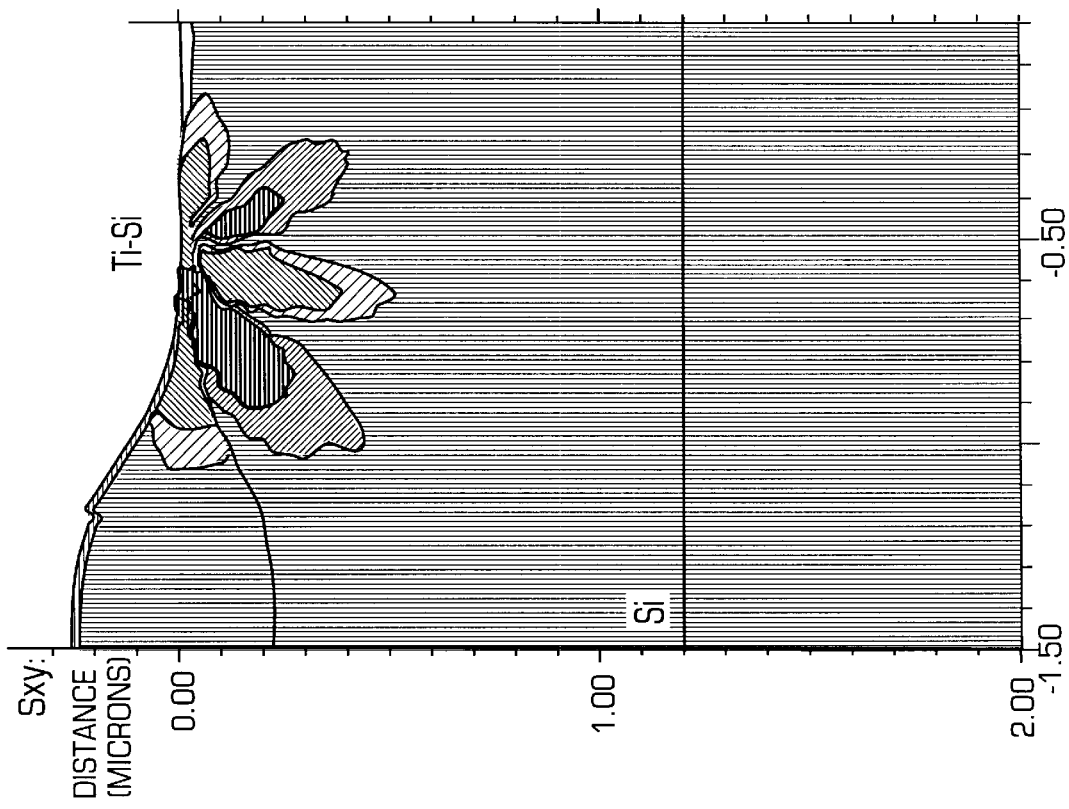
FIG. 35 shows a simulation result using the simulator.
Figure 35A:
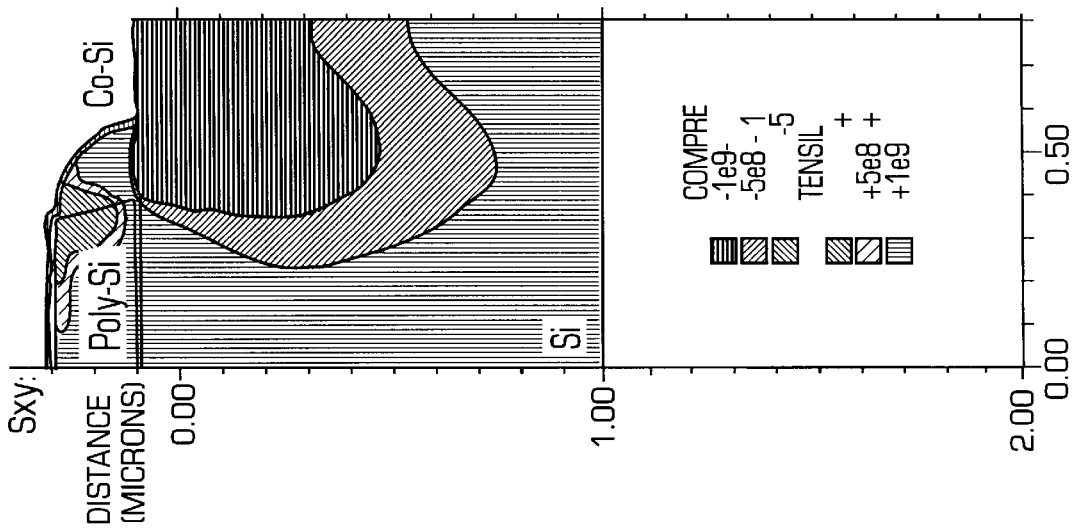
Figure 36A:
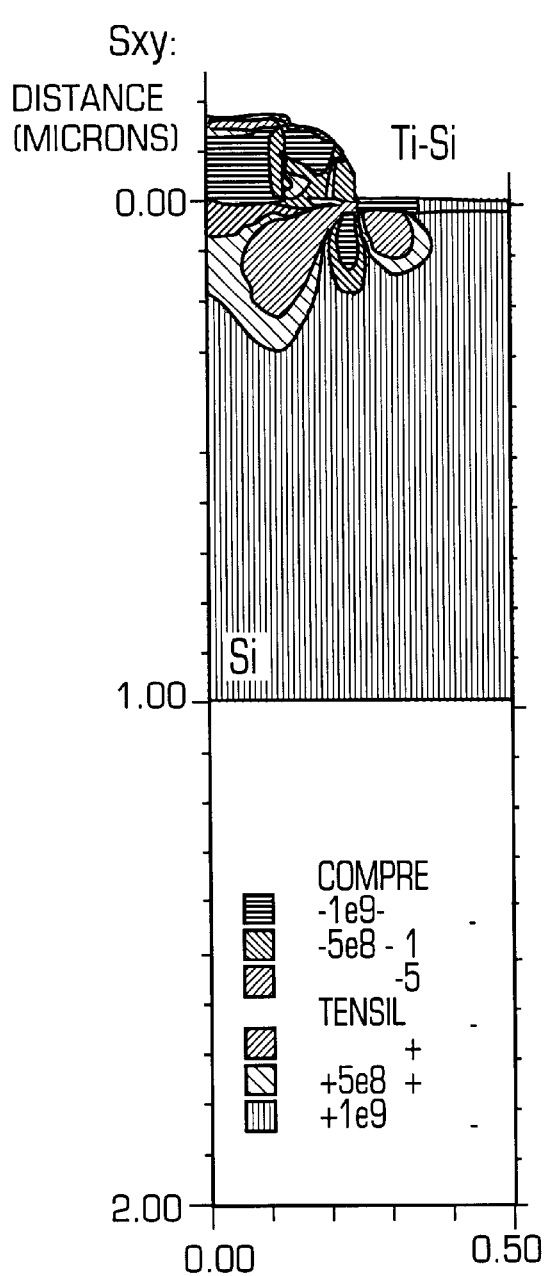
FIG. 36 is a simulation result which using the simulator.
Figure 36B:
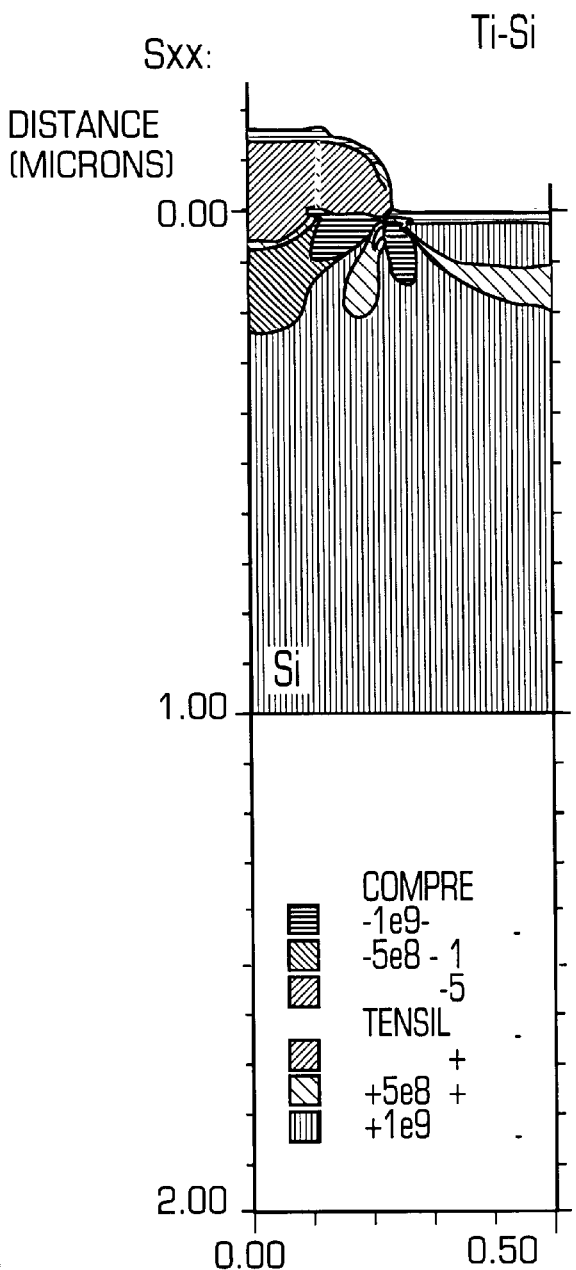

FIG. 34 shows a simulation result using specially optimized simulator. FIG. 35 shows another simulation result using specially optimized simulator. FIG. 36 is a simulation result using specially optimized simulator.

As used herein, the term "holes" includes "voids" or "trenches".

What is claimed:

1. A method of reducing crystalline defects in a semiconductor substrate, having a first insulator thereon, and for depositing a metal on said first insulator to form metal silicide with said semiconductor substrate, said improvement comprising:

etching said first insulator to create an overhang, by an amount equal to at least one half of the thickness of said metal, thereby creating a void between a surface of said semiconductor substrate and said first insulator;

depositing said metal on said first insulator and on said surface of said semiconductor substrate; and heating said semiconductor substrate thereby forming metal silicide on said surface of said semiconductor substrate.

2. The method of claim 1 further comprising the steps of forming a second insulator on said semiconductor substrate and depositing a layer of polysilicon on said second insulator.

3. The method of claim 2 wherein said first insulator is etched to create said overhang with respect to said second insulator.

4. The method of claim 2 wherein said first insulator comprises a sidewall of LP—$Si_3N_4$ adjacent said second insulator and said polysilicon.

5. A method of forming a transistor in a semiconductor substrate comprising:

cutting a plurality of holes in said semiconductor substrate;

oxidizing said holes;

filling said holes with insulating material;

annealing said semiconductor substrate in an $N_2$ ambient pressure with an $O_2$ partial pressure of less than about $10^{-4}$ atmosphere, at a temperature between about 950° C. and about 1050° C., thereby forming isolation regions;

forming a first insulator on said semiconductor substrate;

depositing a polysilicon layer on said first insulator;

forming sidewalls of LP—$Si_3N_4$ adjacent said first insulator and said polysilicon layer;

forming source and drain regions in said semiconductor substrate, adjacent said sidewalls;

etching said sidewalls to create an overhang, by an amount equal to at least one half of thickness of said metal, thereby creating a void between a surface of said semiconductor substrate and said sidewalls;

depositing a metal on said polysilicon layer and surface, said source/drain regions; and heating said semiconductor substrate thereby forming metal silicide on said surface of said semiconductor.

6. The method of claim 5 wherein said $O_2$ partial pressure is less than about $10^{-4}$ atmosphere.

7. The method of claim 5 wherein said temperature is about 1025° C.

* * * * *